US012563830B2

(12) United States Patent
Khaderbad et al.

(10) Patent No.: US 12,563,830 B2
(45) Date of Patent: ***Feb. 24, 2026

(54) SEMICONDUCTOR DEVICES INCLUDING TWO-DIMENSIONAL MATERIAL AND METHODS OF FABRICATION THEREOF

(71) Applicant: TAIWAN SEMICONDUCTOR MANUFACTURING COMPANY, LTD., Hsinchu (TW)

(72) Inventors: Mrunal Abhijith Khaderbad, Hsinchu (TW); Sathaiya Dhanyakumar Mahaveer, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 18/752,906

(22) Filed: Jun. 25, 2024

(65) Prior Publication Data

US 2024/0347540 A1 Oct. 17, 2024

Related U.S. Application Data

(63) Continuation of application No. 17/884,772, filed on Aug. 10, 2022, now Pat. No. 12,040,328, which is a continuation of application No. 17/103,991, filed on Nov. 25, 2020, now Pat. No. 11,450,666.

(51) Int. Cl.
| | |
|---|---|
| *H01L 27/092* | (2006.01) |
| *H01L 21/8238* | (2006.01) |
| *H01L 29/423* | (2006.01) |
| *H01L 29/76* | (2006.01) |
| *H01L 29/786* | (2006.01) |

| | |
|---|---|
| *H10D 30/67* | (2025.01) |
| *H10D 48/36* | (2025.01) |
| *H10D 84/01* | (2025.01) |
| *H10D 84/03* | (2025.01) |
| *H10D 84/85* | (2025.01) |

(52) U.S. Cl.
CPC ....... *H10D 84/853* (2025.01); *H10D 30/6735* (2025.01); *H10D 30/6757* (2025.01); *H10D 48/362* (2025.01); *H10D 84/0193* (2025.01); *H10D 84/038* (2025.01)

(58) Field of Classification Search
CPC ............. H10D 84/853; H10D 30/6735; H10D 30/6757; H10D 48/362; H10D 84/0193; H10D 84/038; H02K 15/027; A61K 40/4218
USPC .......................................................... 257/29
See application file for complete search history.

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |

(Continued)

*Primary Examiner* — Tong-Ho Kim
(74) *Attorney, Agent, or Firm* — NZ Carr Law Office

(57) ABSTRACT

According to embodiments of the present disclosure, two-dimensional (2D) materials may be used as nanosheet channels for multi-channel transistors. Nanosheet channels made two-dimensional (2D) materials can achieve the same drive current at smaller dimensions and/or fewer number of channels, therefore enable scaling down and/or boost derive current. Embodiments of the present disclosure also provide a solution of P-type and N-type balancing in a device without increasing footprint of the device.

20 Claims, 50 Drawing Sheets

(56)         References Cited

U.S. PATENT DOCUMENTS

| | | | |
|---|---|---|---|
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 10,388,732 B1 * | 8/2019 | Frougier | H10D 30/6744 |
| 11,450,666 B2 | 9/2022 | Khaderbad et al. | |
| 12,040,328 B2 * | 7/2024 | Khaderbad | H10D 84/853 |

* cited by examiner

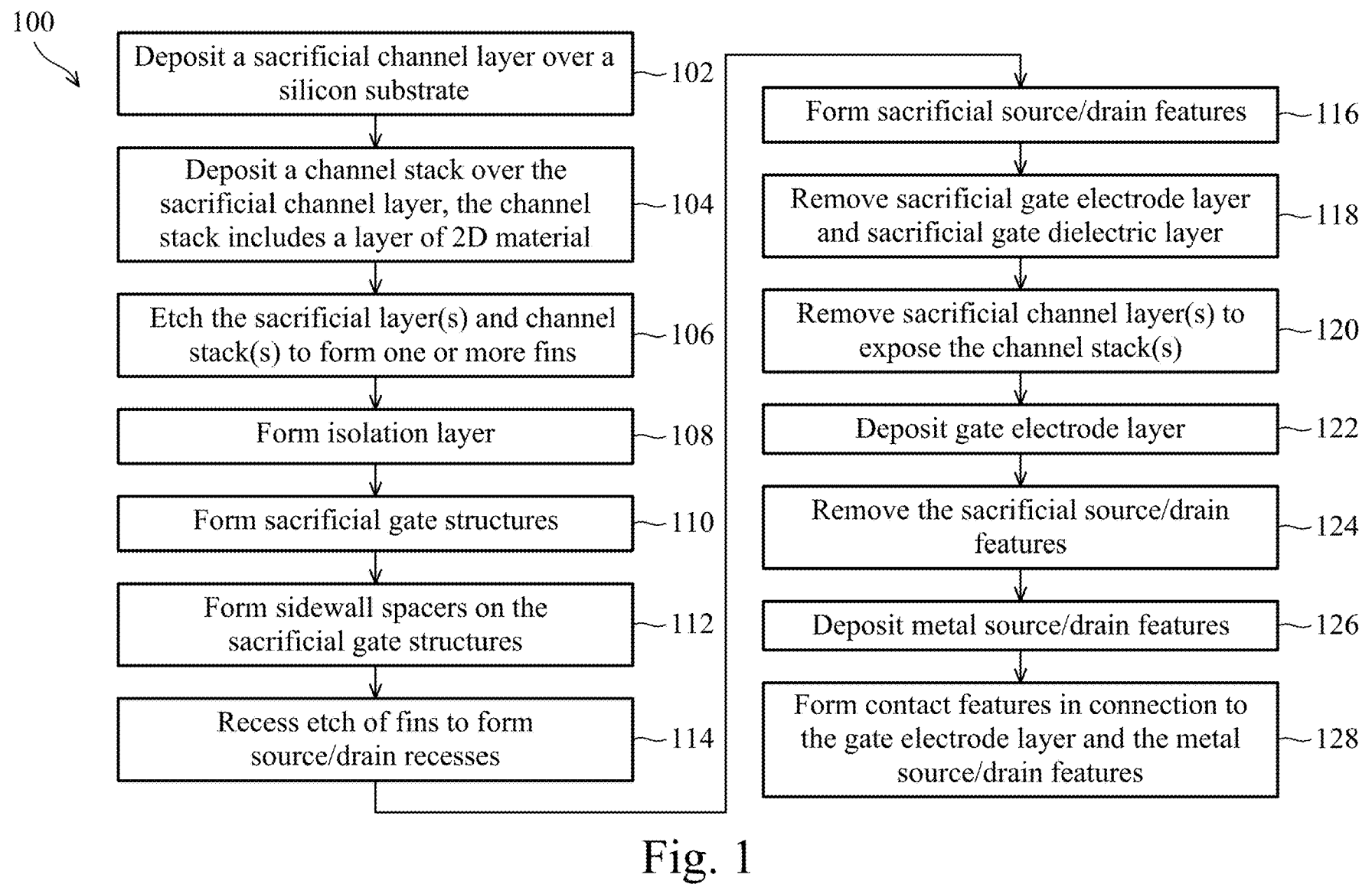

100

102 Deposit a sacrificial channel layer over a silicon substrate

104 Deposit a channel stack over the sacrificial channel layer, the channel stack includes a layer of 2D material 106 Etch the sacrificial layer(s) and channel stack(s) to form one or more fins 108 Form isolation layer 110 Form sacrificial gate structures 112 Form sidewall spacers on the sacrificial gate structures 114 Recess etch of fins to form source/drain recesses 116 Form sacrificial source/drain features 118 Remove sacrificial gate electrode layer and sacrificial gate dielectric layer 120 Remove sacrificial channel layer(s) to expose the channel stack(s)

122 Deposit gate electrode layer

124 Remove the sacrificial source/drain features

126 Deposit metal source/drain features

128 Form contact features in connection to the gate electrode layer and the metal source/drain features

Fig. 1

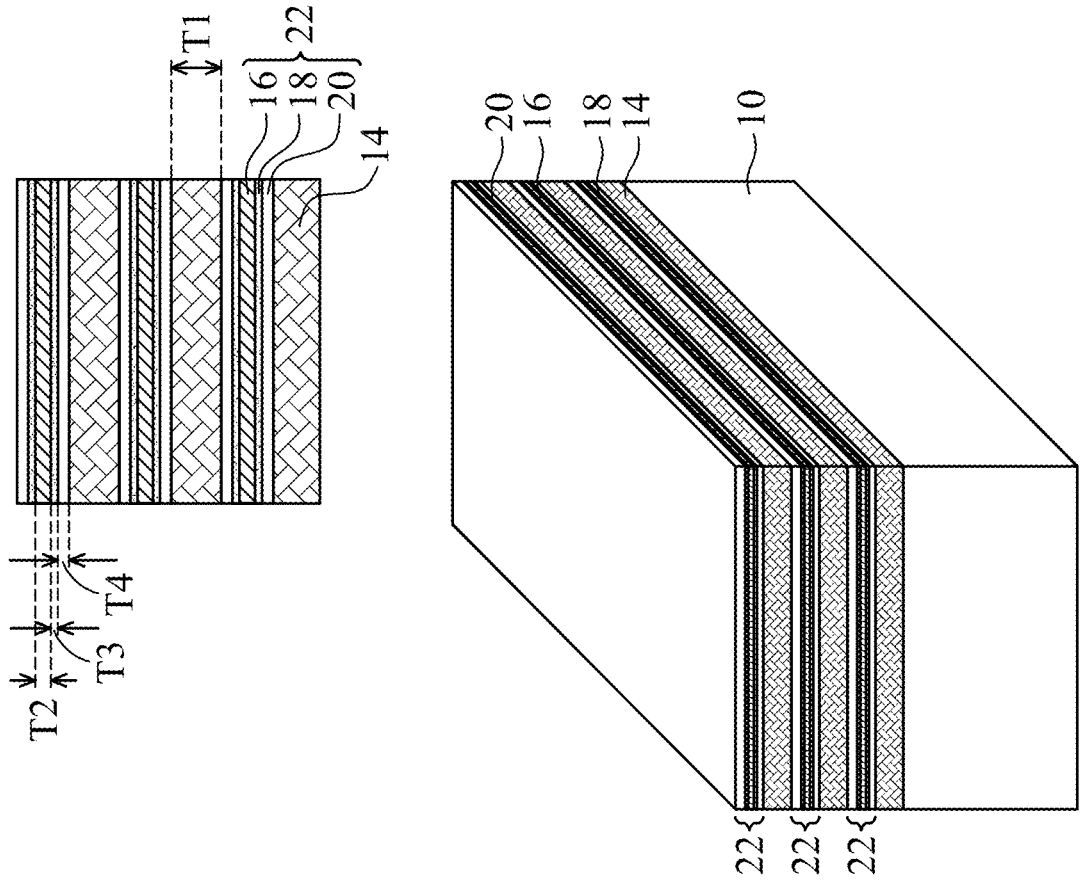
Fig. 2
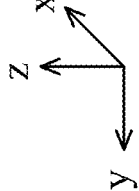

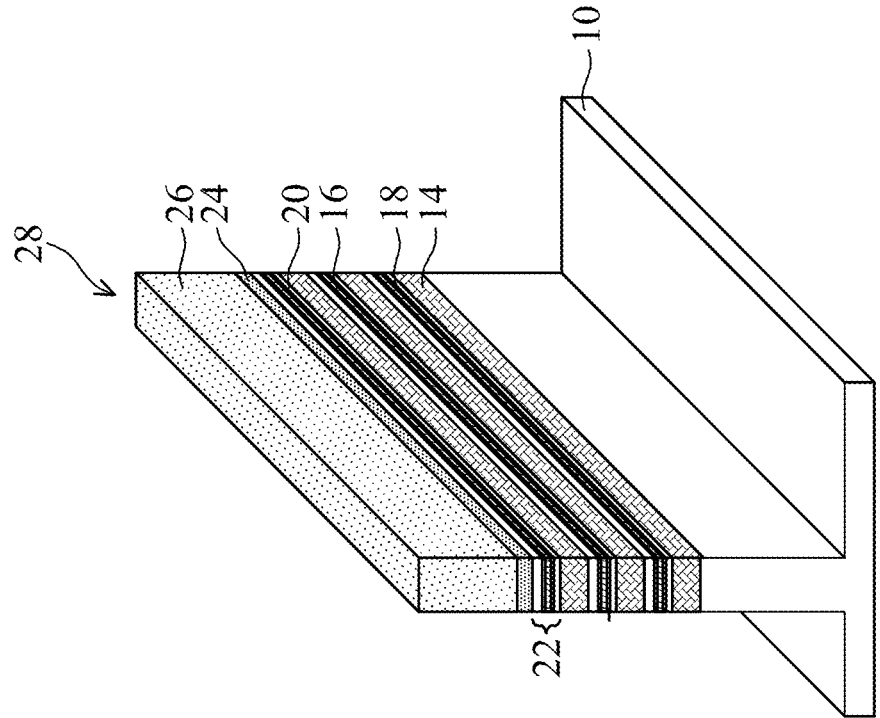
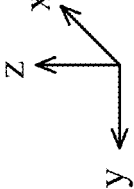
Fig. 3

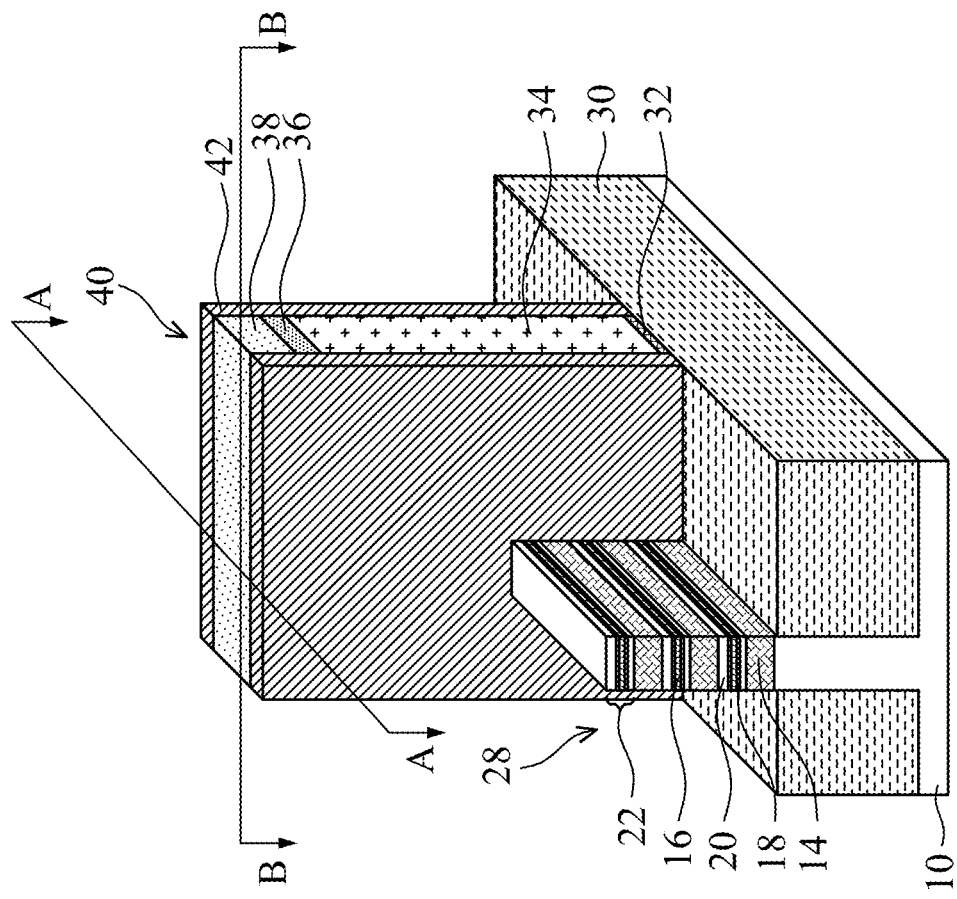
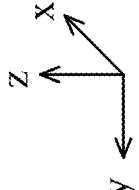
Fig. 4

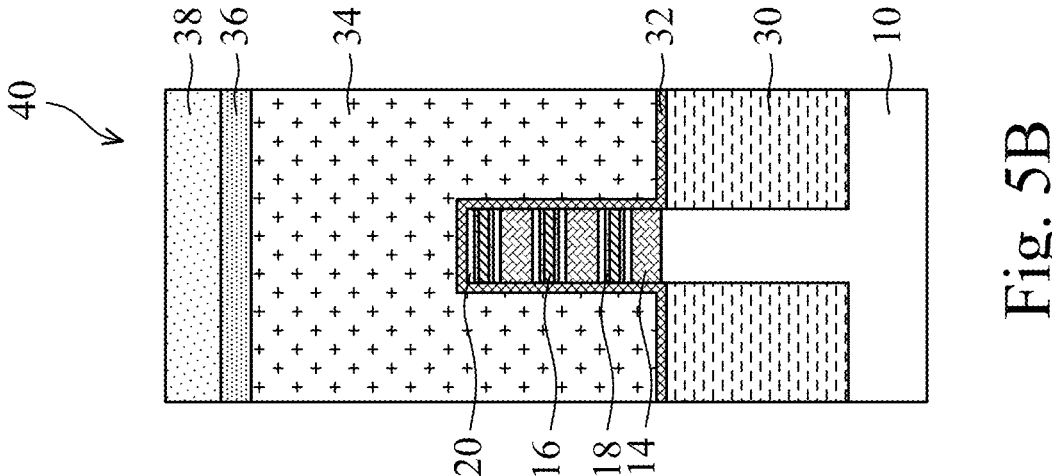
Fig. 5B
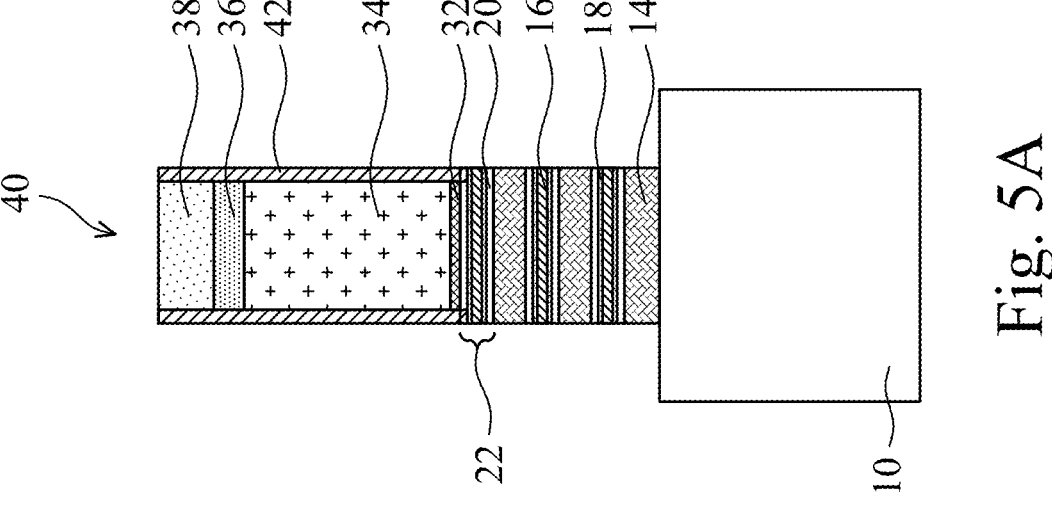
Fig. 5A
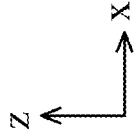

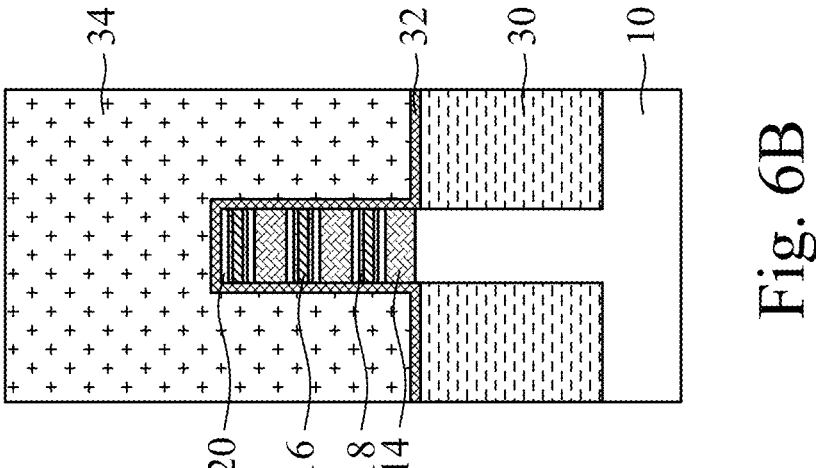
Fig. 6B
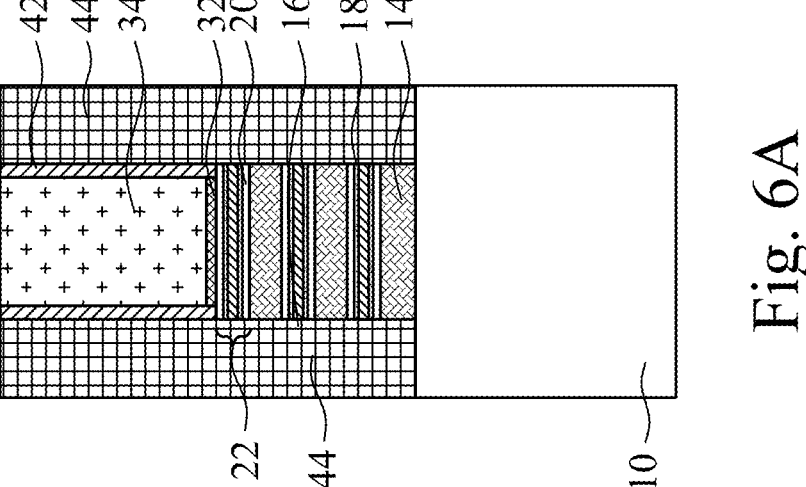
Fig. 6A
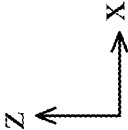

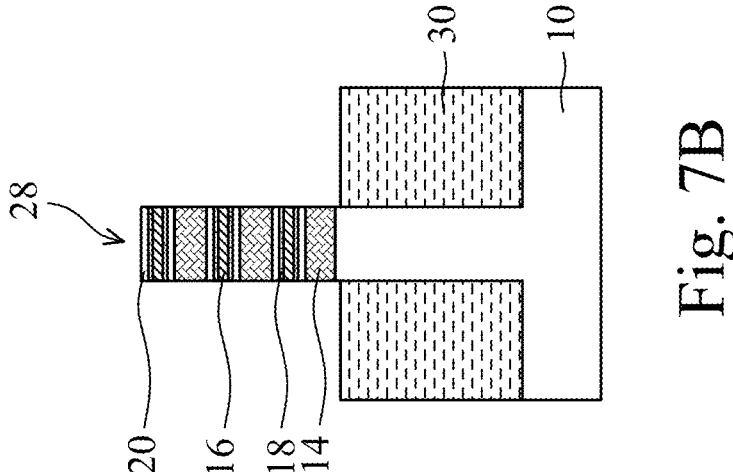
Fig. 7B
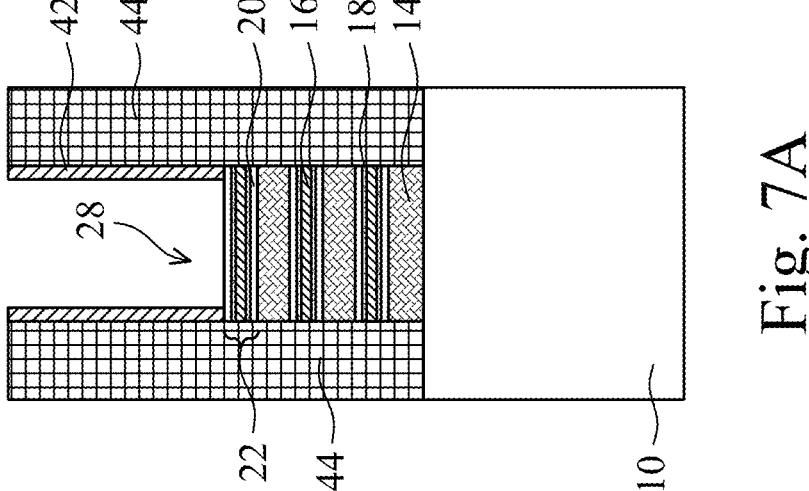
Fig. 7A
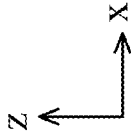

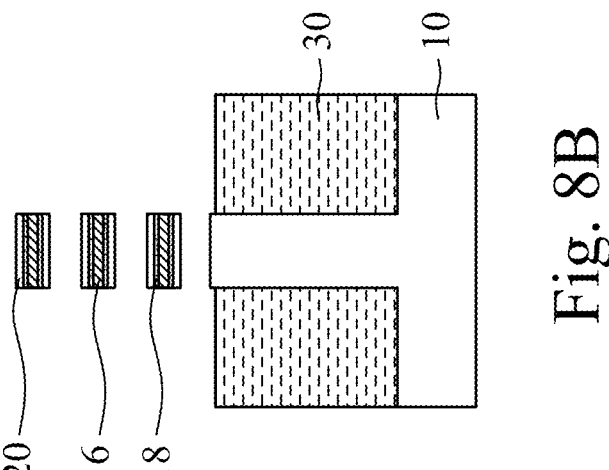
Fig. 8B
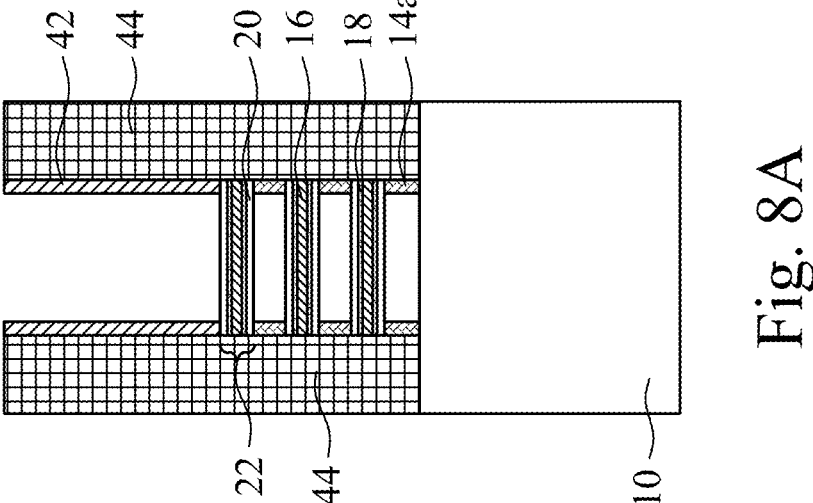
Fig. 8A
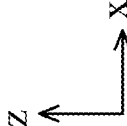

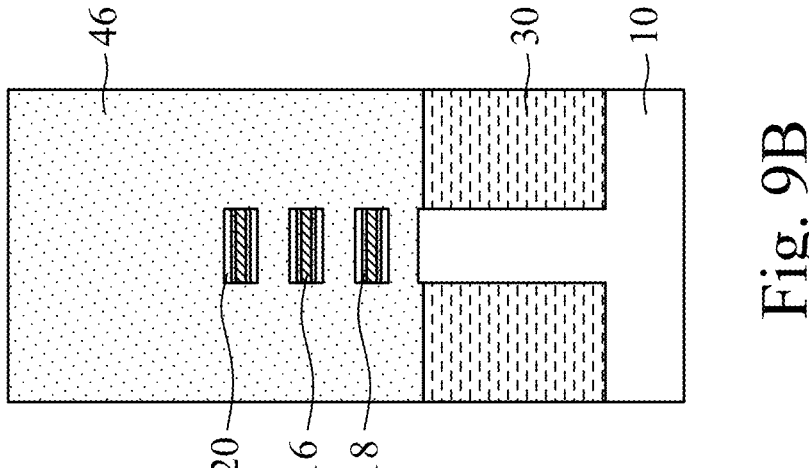
Fig. 9B
Fig. 9A
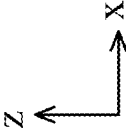

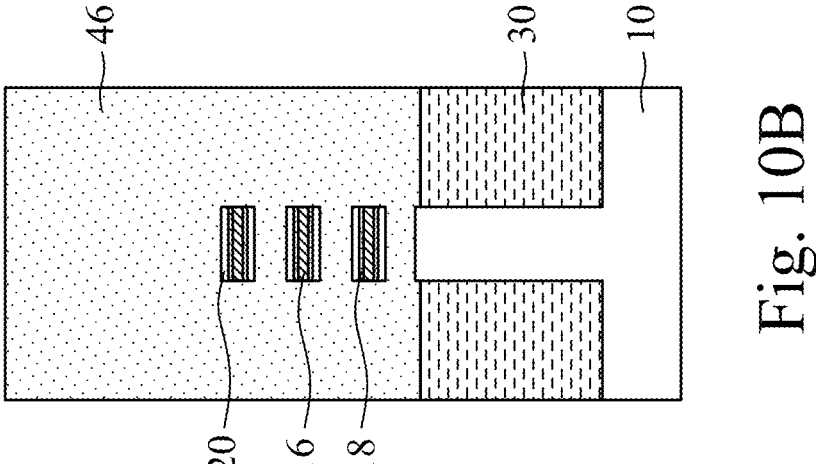
Fig. 10B
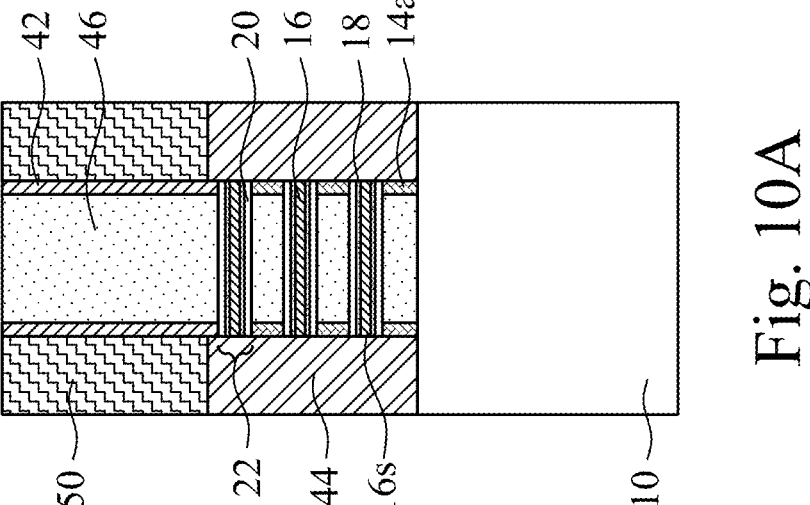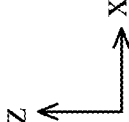
Fig. 10A

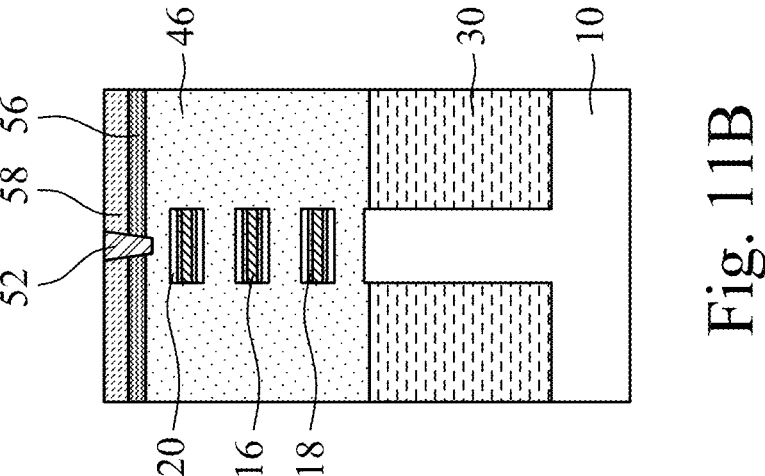
Fig. 11B
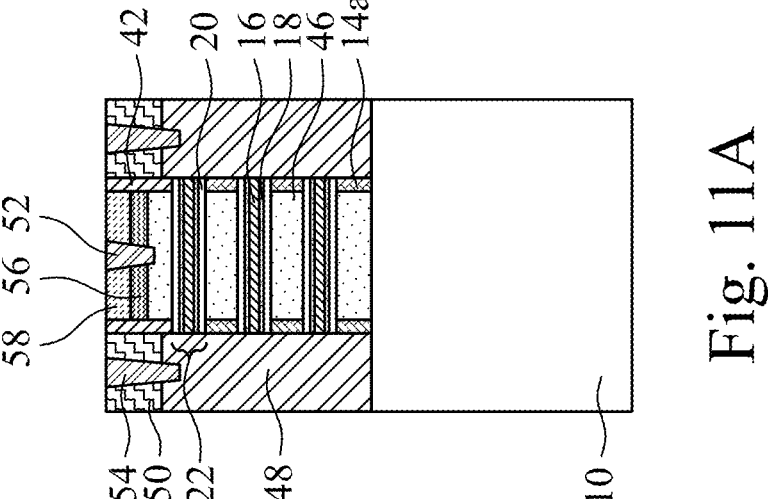
Fig. 11A
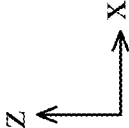

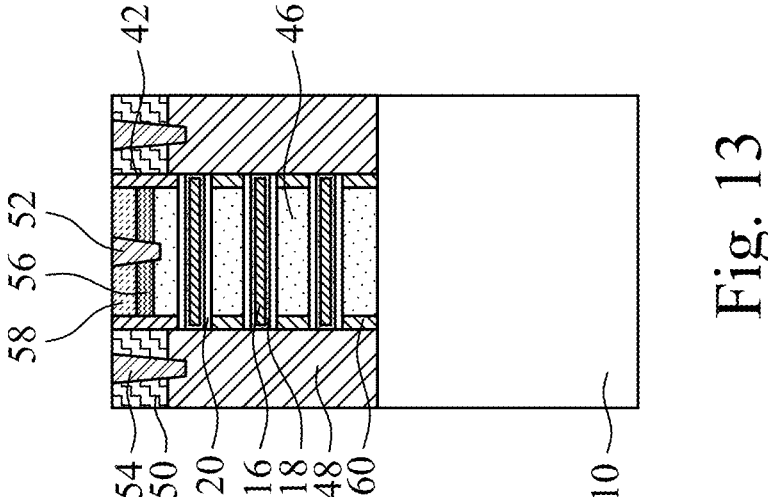
Fig. 13
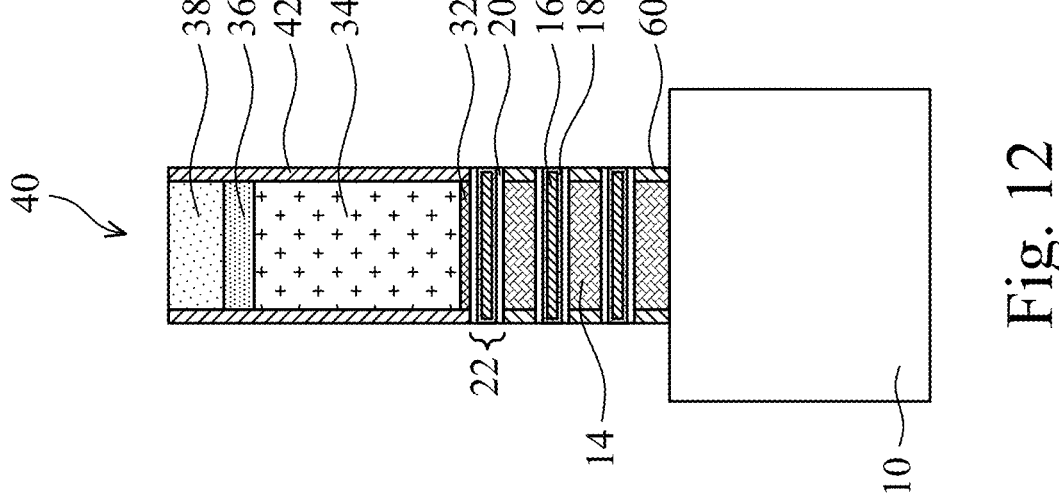
Fig. 12
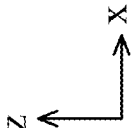

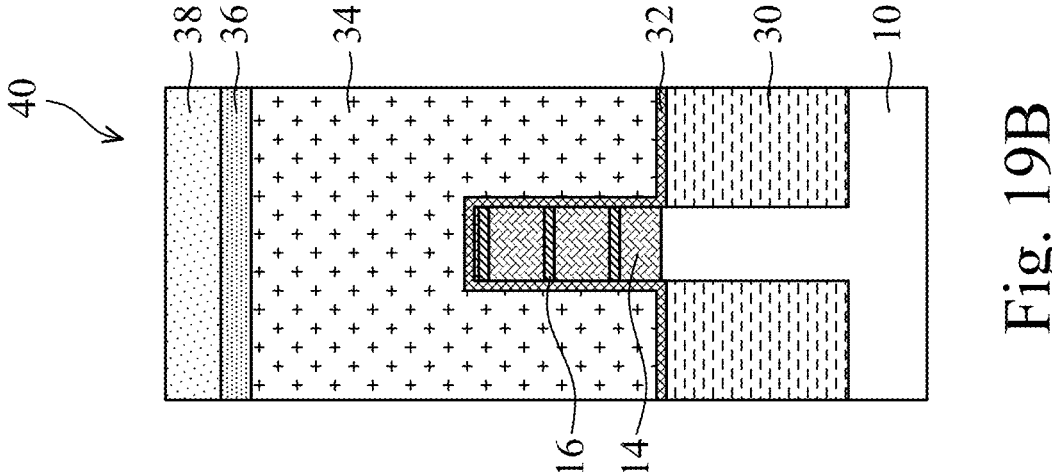
Fig. 19B
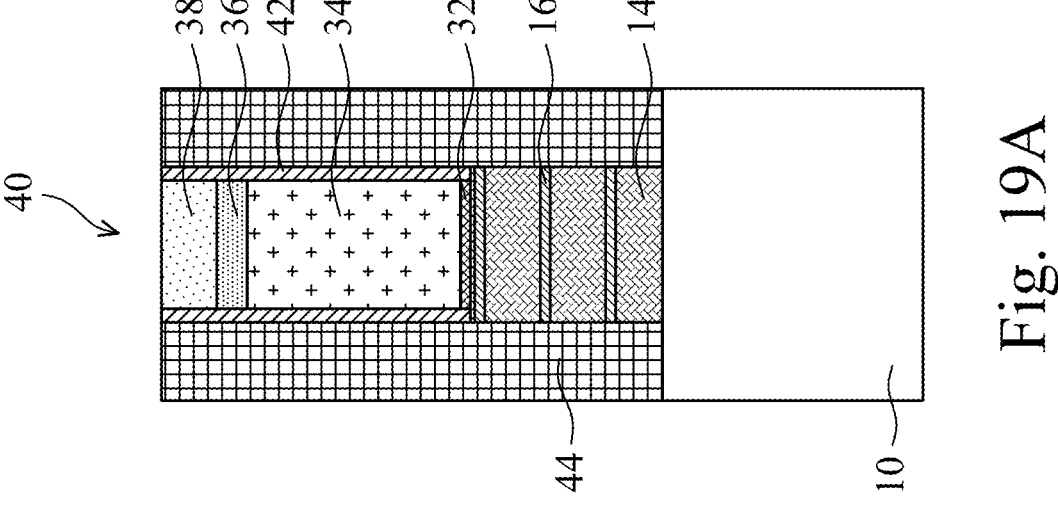
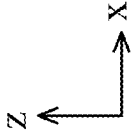
Fig. 19A

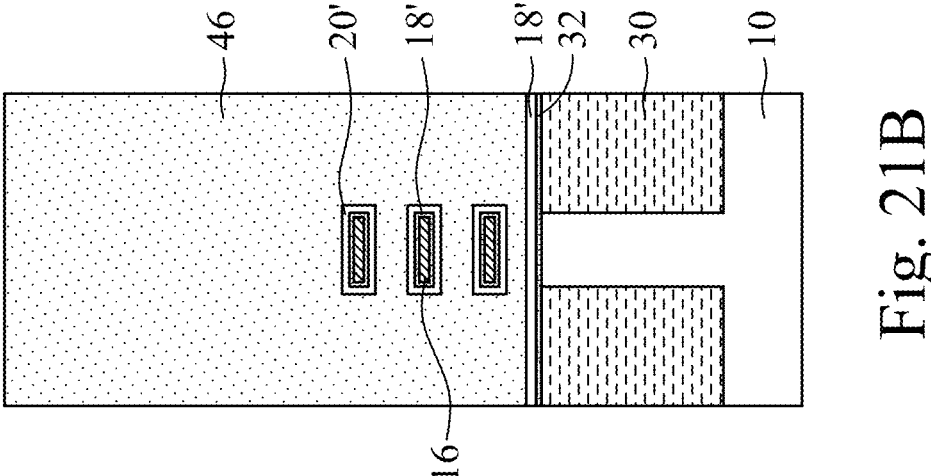
Fig. 21B
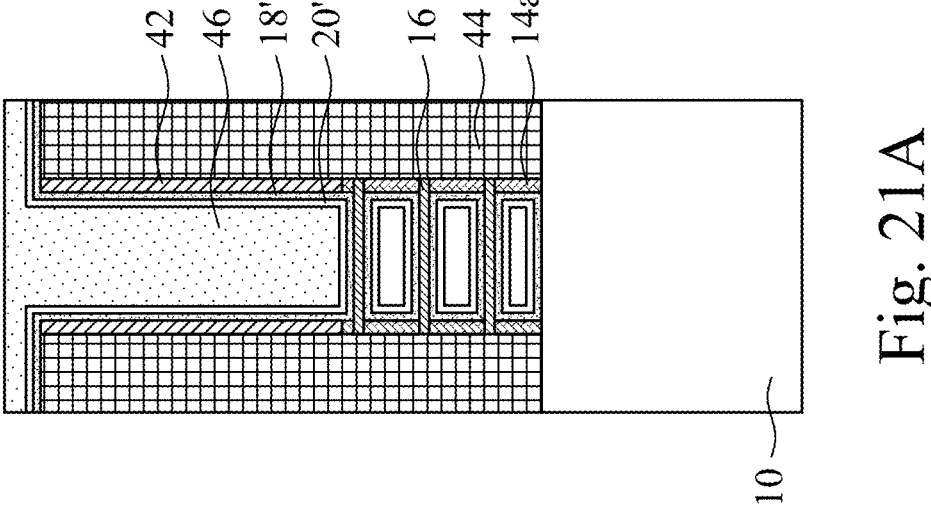
Fig. 21A
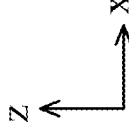

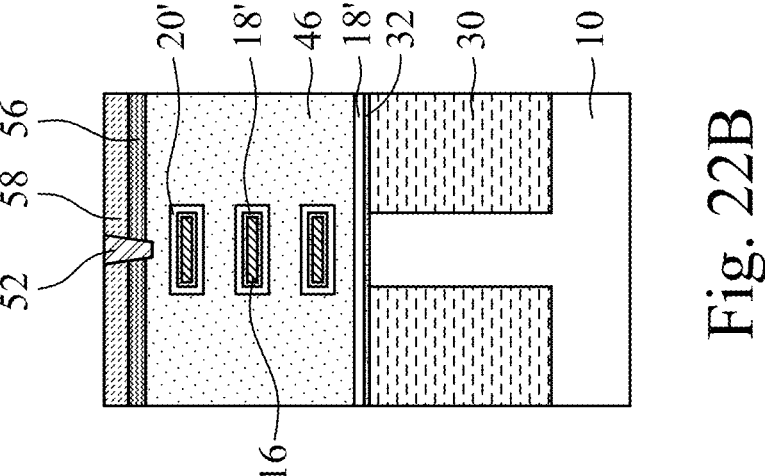
Fig. 22B
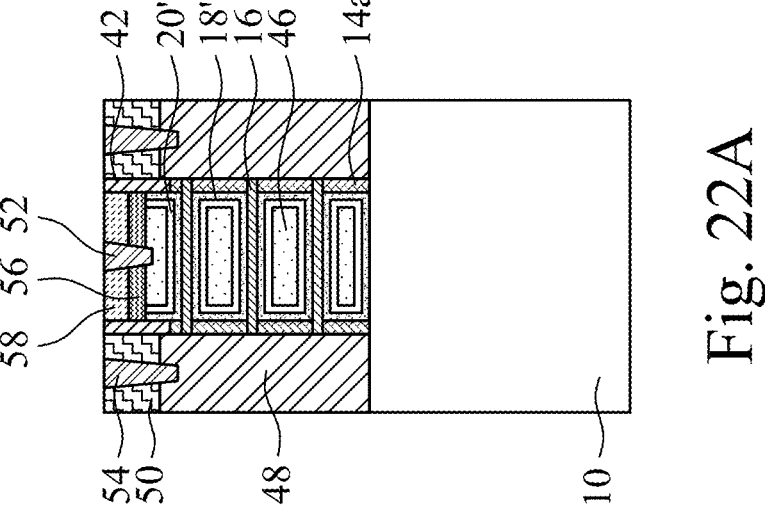
Fig. 22A
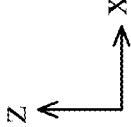

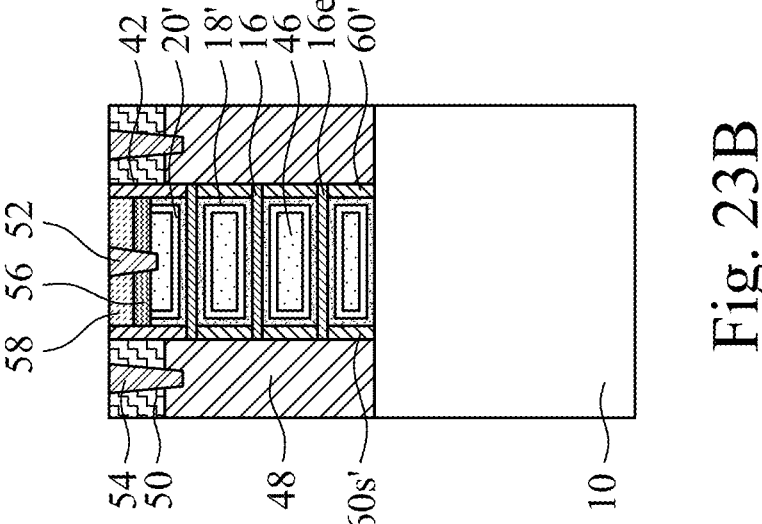
Fig. 23B
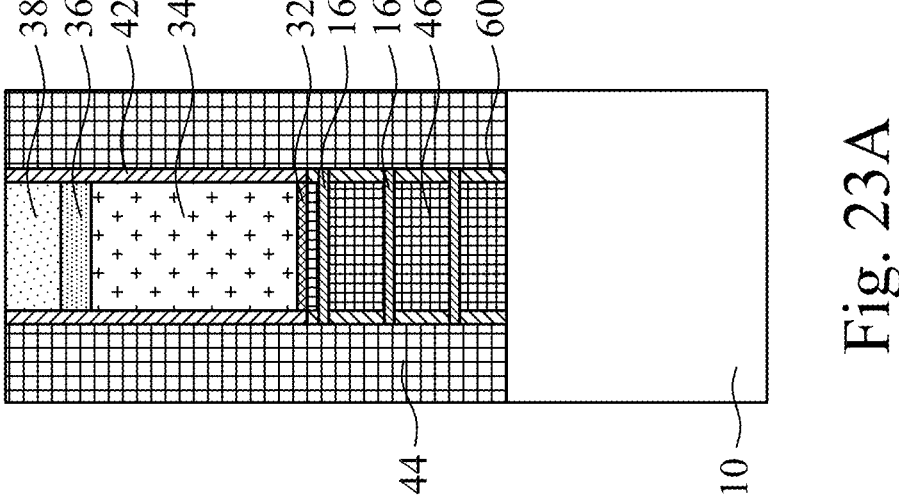
Fig. 23A
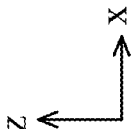

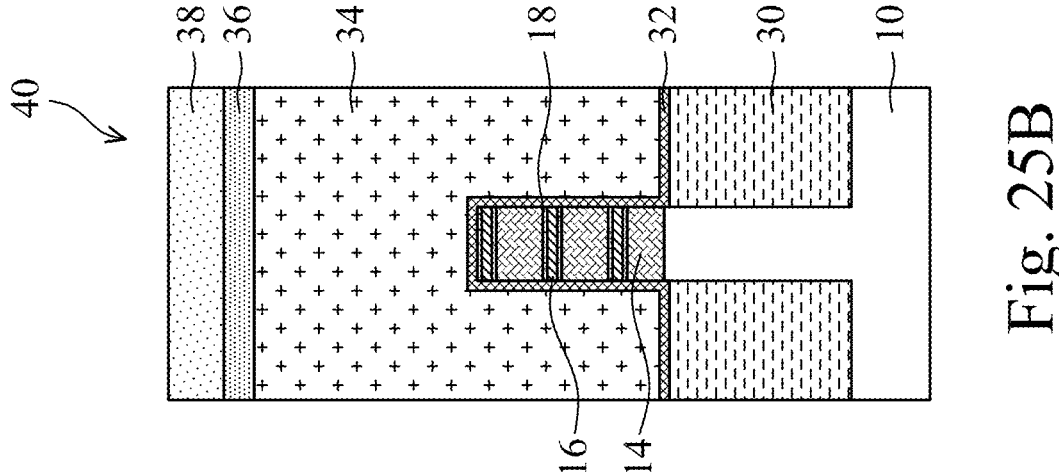
Fig. 25B
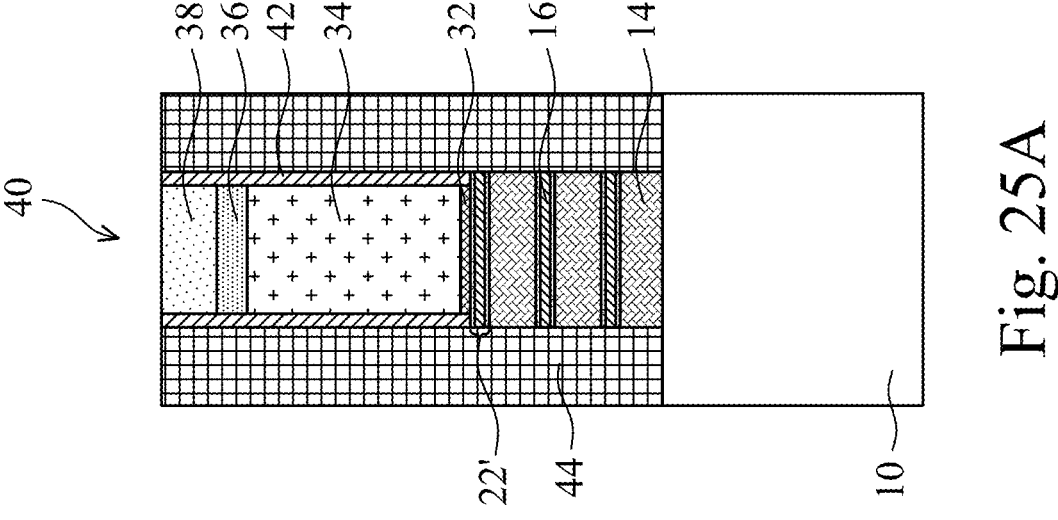
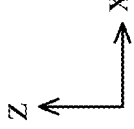
Fig. 25A

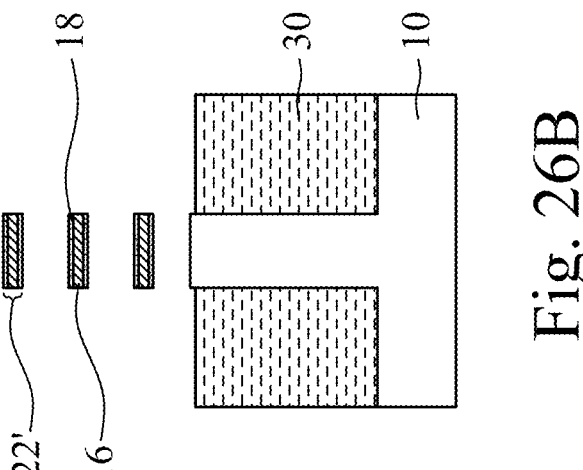
Fig. 26B
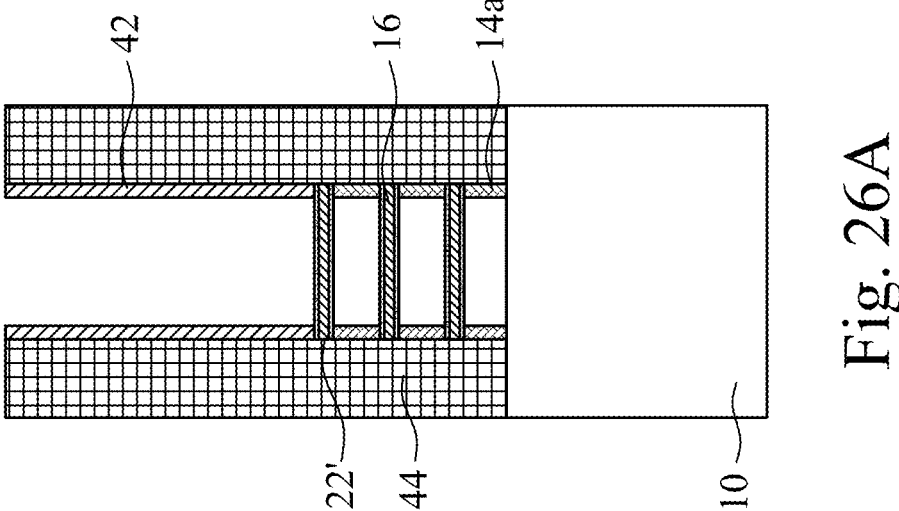
Fig. 26A
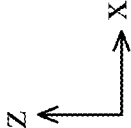

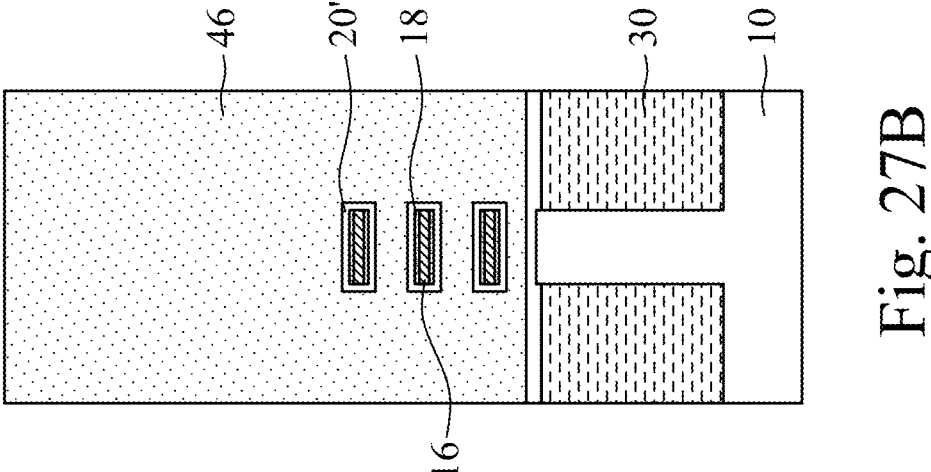
Fig. 27B
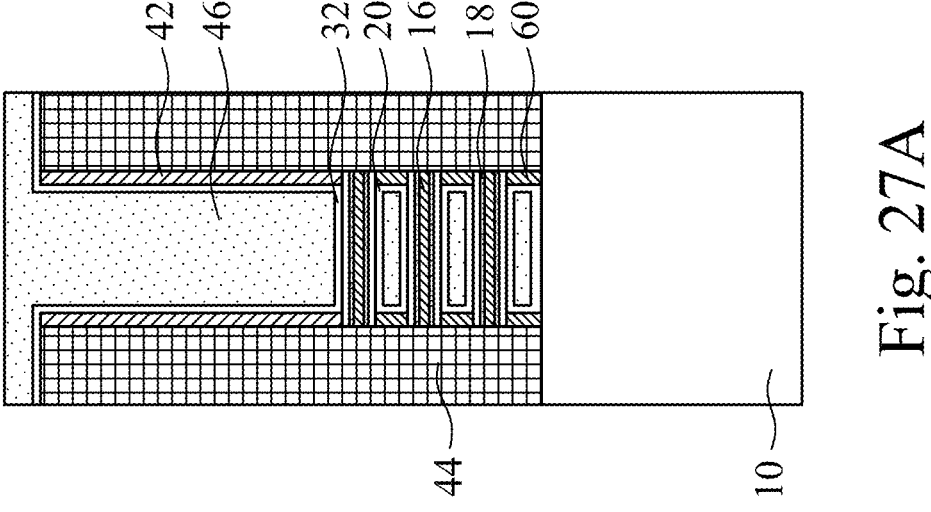
Fig. 27A
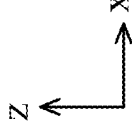

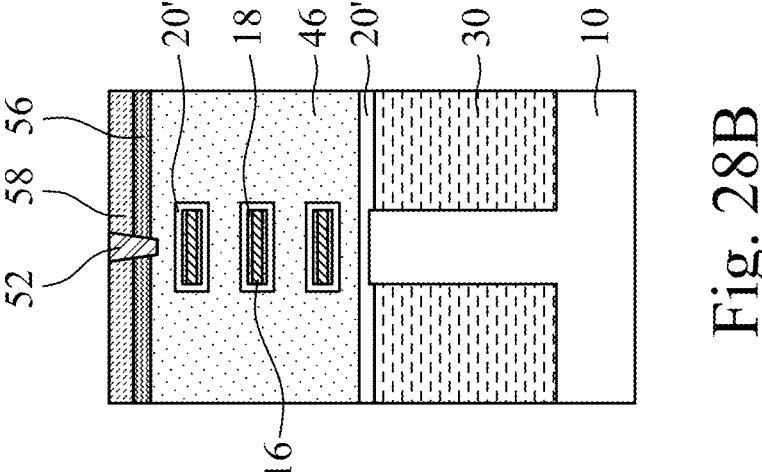
Fig. 28B
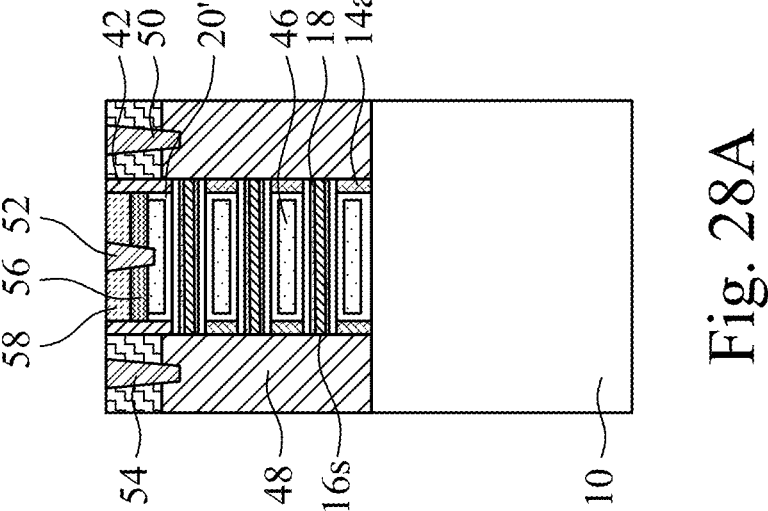
Fig. 28A
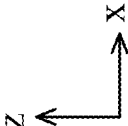

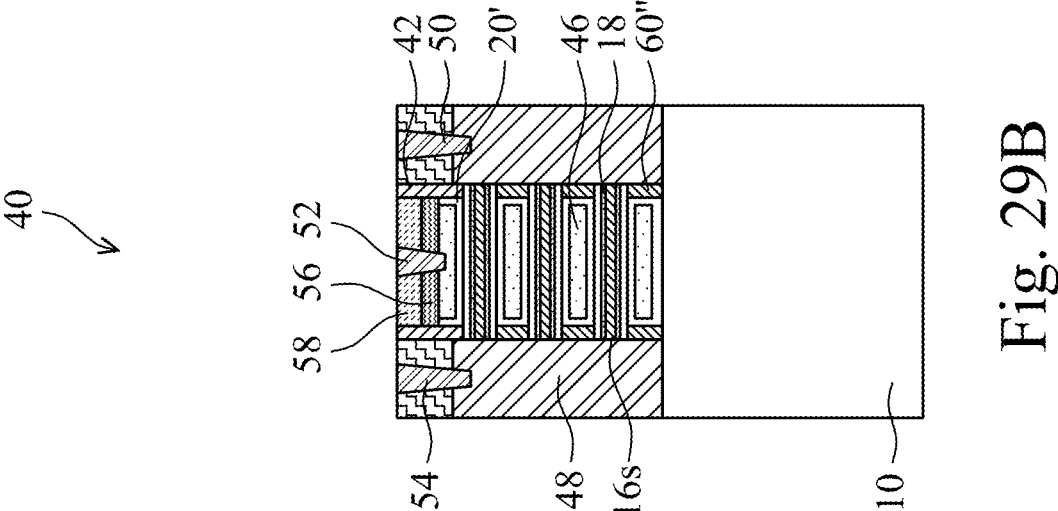
Fig. 29B
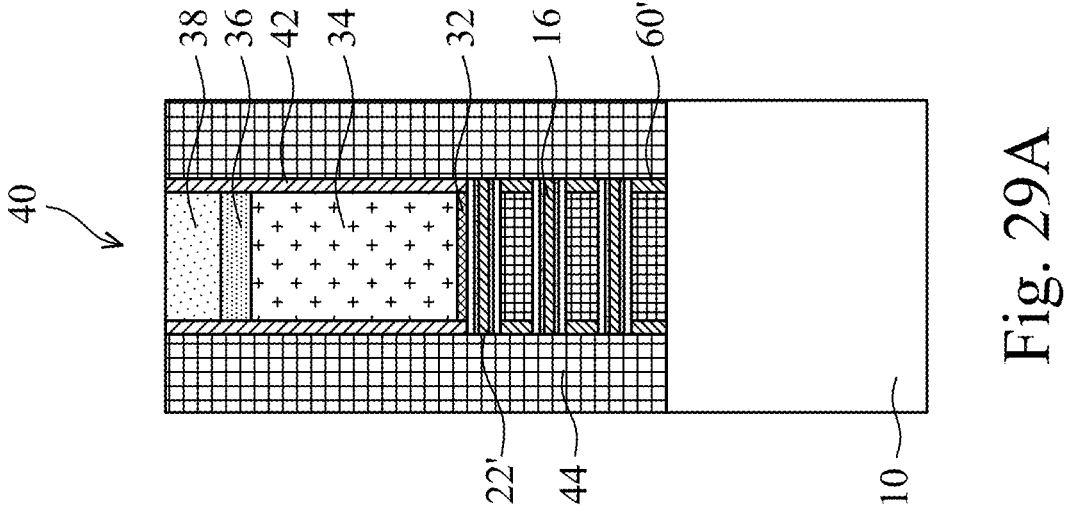
Fig. 29A
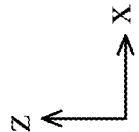

200

Depositing film stacks for p-type devices — 202

Deposit a film stack for n-type devices — 204

Form fin structures — 206

Form a plurality of hybrid fins — 208

Form sacrificial gate structures — 210

Form sidewall spacers on the sacrificial gate structures — 212

Recess etch of fin structures to make source/drain recesses — 214

Form inner spacers — 216

Form sacrificial source/drain structures — 218

Remove sacrificial gate electrode layer and sacrificial gate dielectric layer over p-type fin structures — 220

Remove sacrificial structures to form nanosheets for p-type channels — 222

Form a replacement gate structure over the p-type channels — 224

Remove sacrificial gate electrode layer and sacrificial gate dielectric layer over n-type fin structures — 226

Remove sacrificial structures to form nanosheets for n-type channels — 228

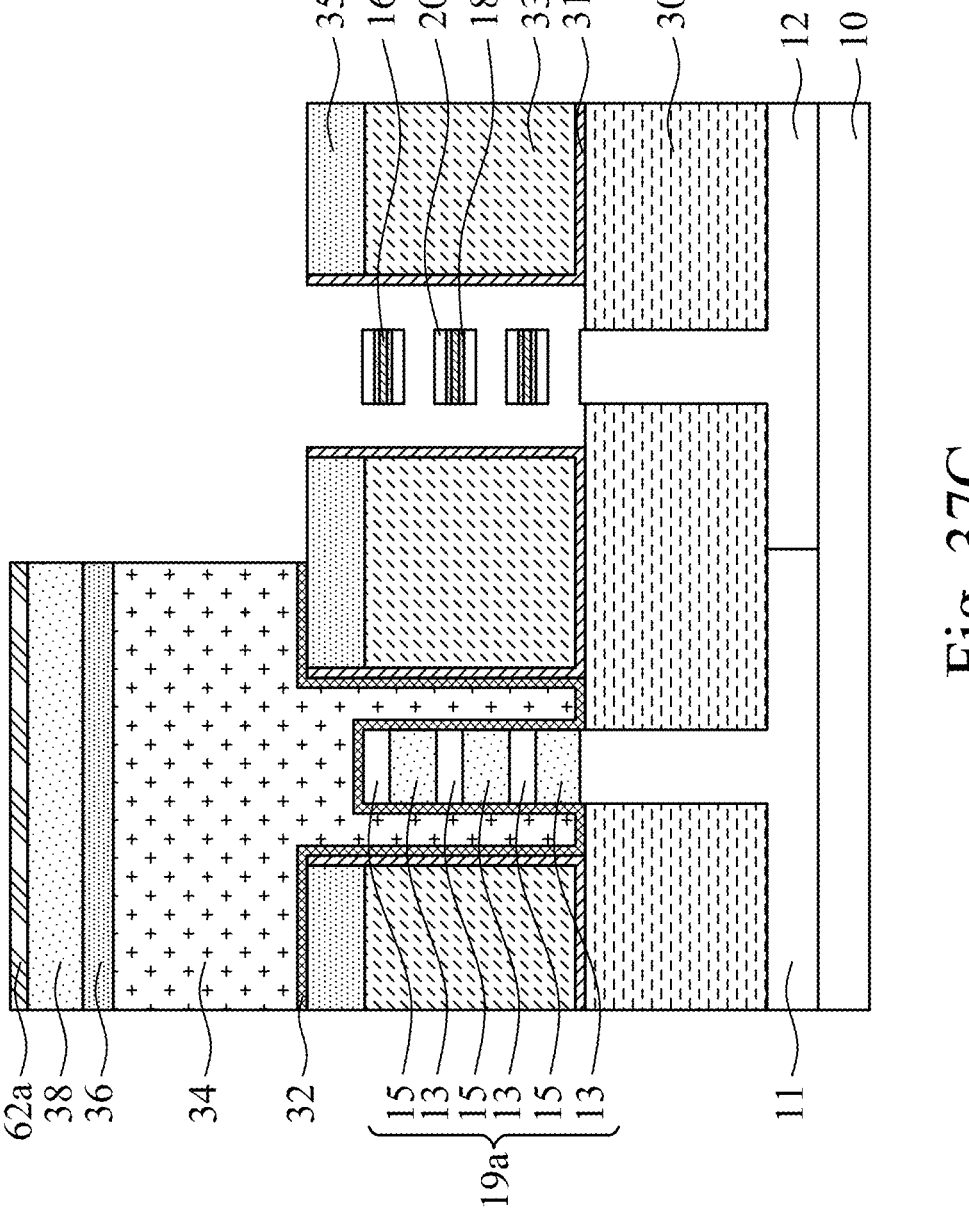
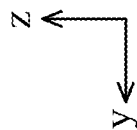
Fig. 37C

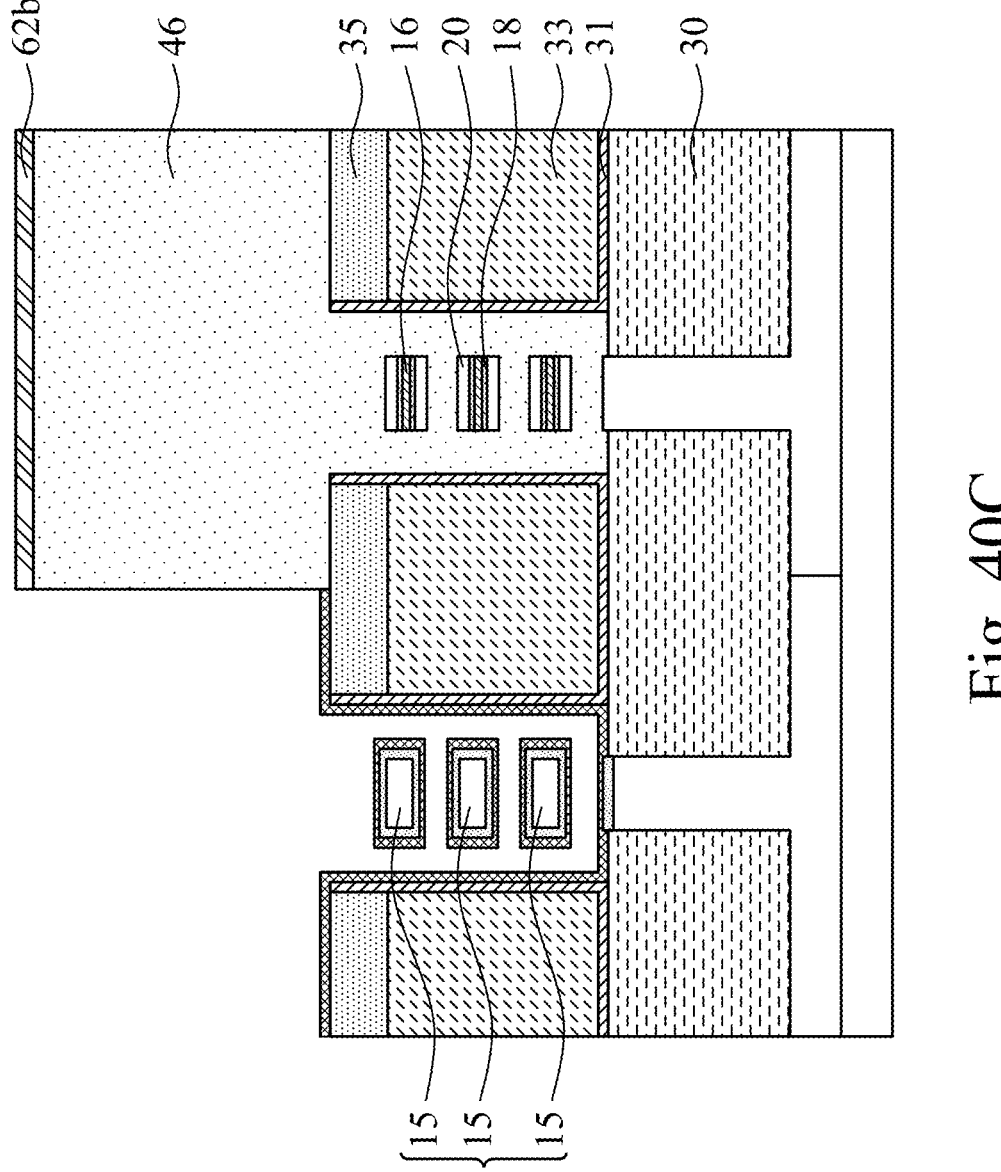
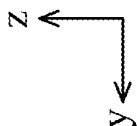
Fig. 40C

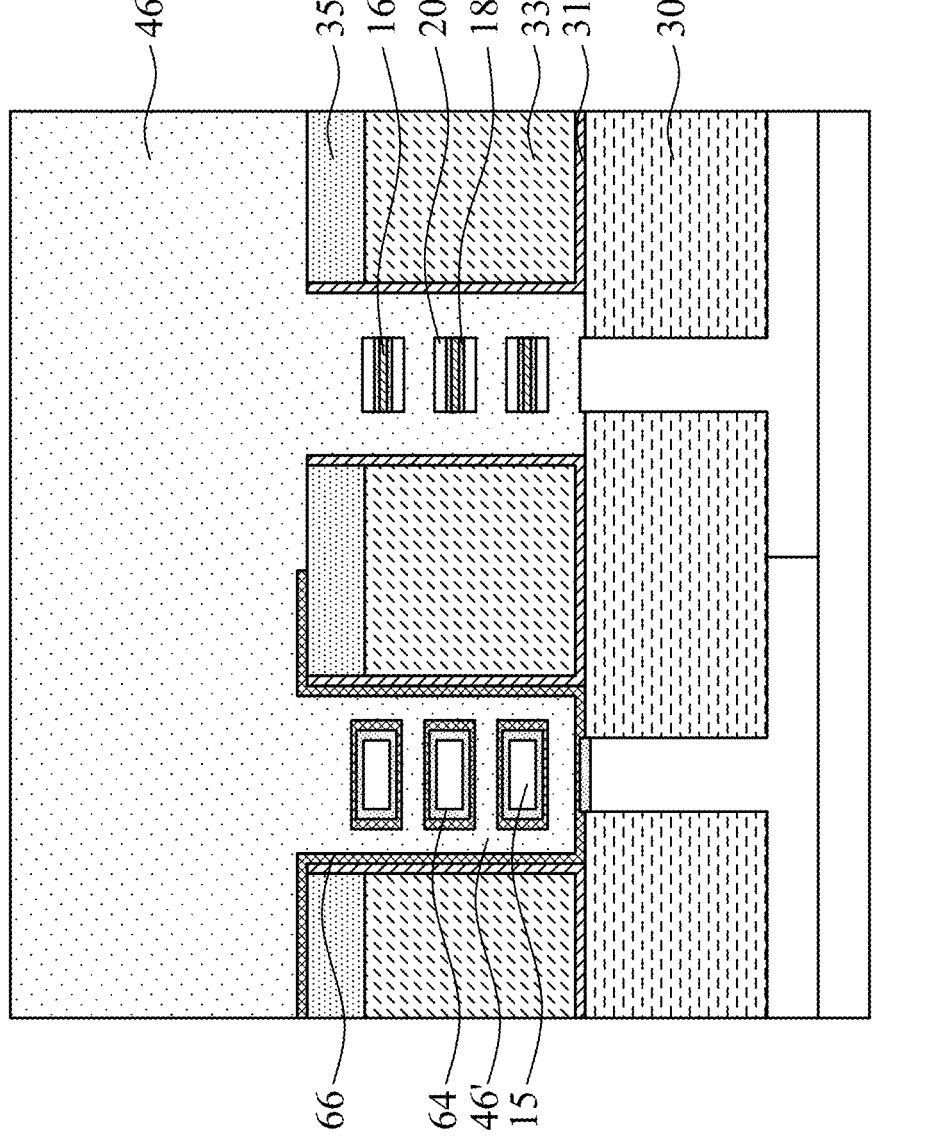
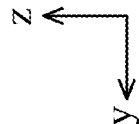
Fig. 42C

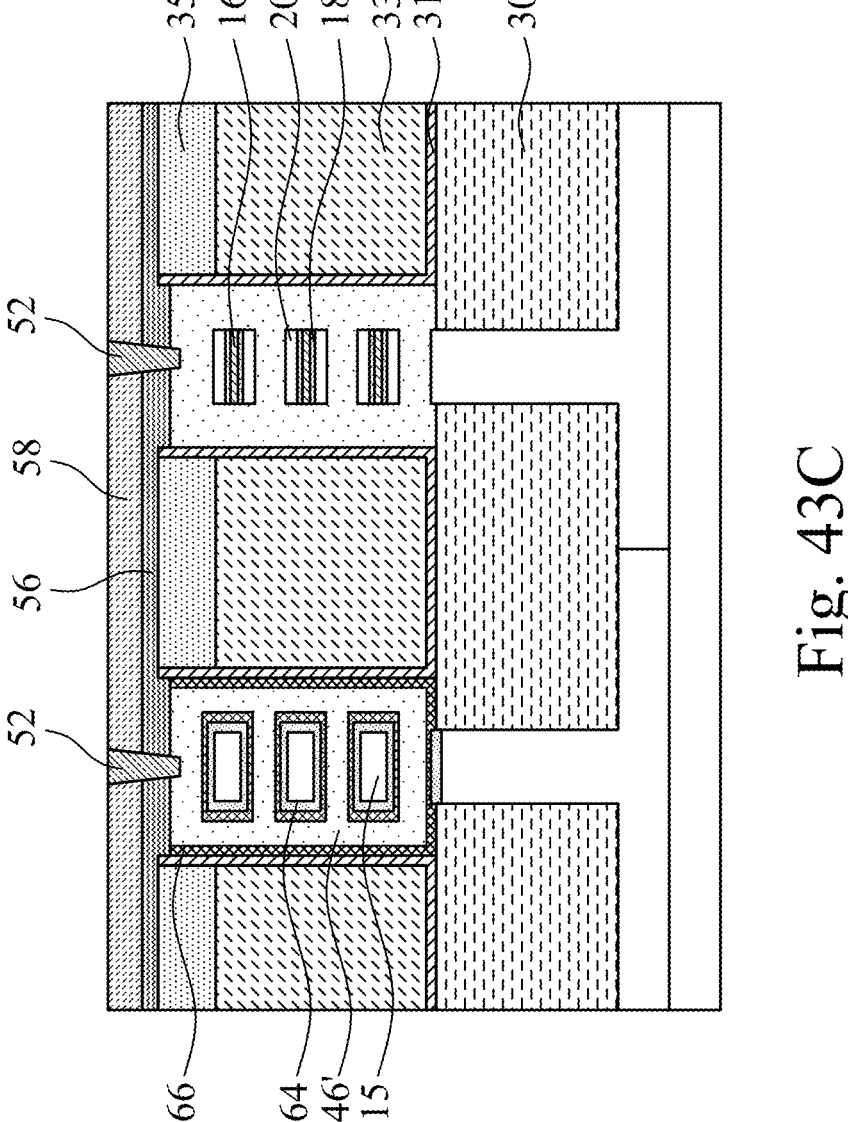
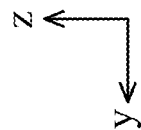
Fig. 43C

SEMICONDUCTOR DEVICES INCLUDING TWO-DIMENSIONAL MATERIAL AND METHODS OF FABRICATION THEREOF

CROSS-REFERENCE TO RELATED APPLICATIONS

This application is a continuation of U.S. patent application Ser. No. 17/884,772 filed Aug. 10, 2022, which is a continuation of U.S. patent application Ser. No. 17/103,991 filed Nov. 25, 2020. Each of the aforementioned application is incorporated by reference in its entirety.

BACKGROUND

The semiconductor industry has experienced continuous rapid growth due to constant improvements in the integration density of various electronic components. For the most part, this improvement in integration density has come from repeated reductions in minimum feature size, allowing more components to be integrated into a given chip area. When semiconductor material is used as a channel material in a transistor, achieving high drive current as minimum feature size reduces becomes difficult. Therefore, there is a need to solve the above problems.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 1 is a flow chart of a method for manufacturing of a semiconductor device according to embodiments of the present disclosure.

FIGS. 2 to 4, and FIGS. 5A-B to FIGS. 11A-B schematically illustrate various stages of manufacturing a semiconductor device according to some embodiments of the present disclosure.

FIGS. 12-13 schematically illustrate various stages of manufacturing a semiconductor device according to another embodiment of the present disclosure.

FIG. 18 and FIGS. 19A-B to FIGS. 22A-B schematically illustrate various stages of manufacturing a semiconductor device according to some embodiments of the present disclosure.

FIGS. 23A-B schematically illustrate various stages of manufacturing a semiconductor device according to another embodiment of the present disclosure.

FIG. 24 and FIGS. 25A-B to FIGS. 28A-B schematically illustrate various stages of manufacturing a semiconductor device according to some embodiments of the present disclosure.

FIGS. 29A-B schematically illustrate various stages of manufacturing a semiconductor device according to another embodiment of the present disclosure.

FIGS. 31 to 34, and FIGS. 35A-C to FIGS. 43A-C schematically illustrate various stages of manufacturing a semiconductor device according to some embodiments of the present disclosure.

DETAILED DESCRIPTION

Figures 14, 15A, 15B:
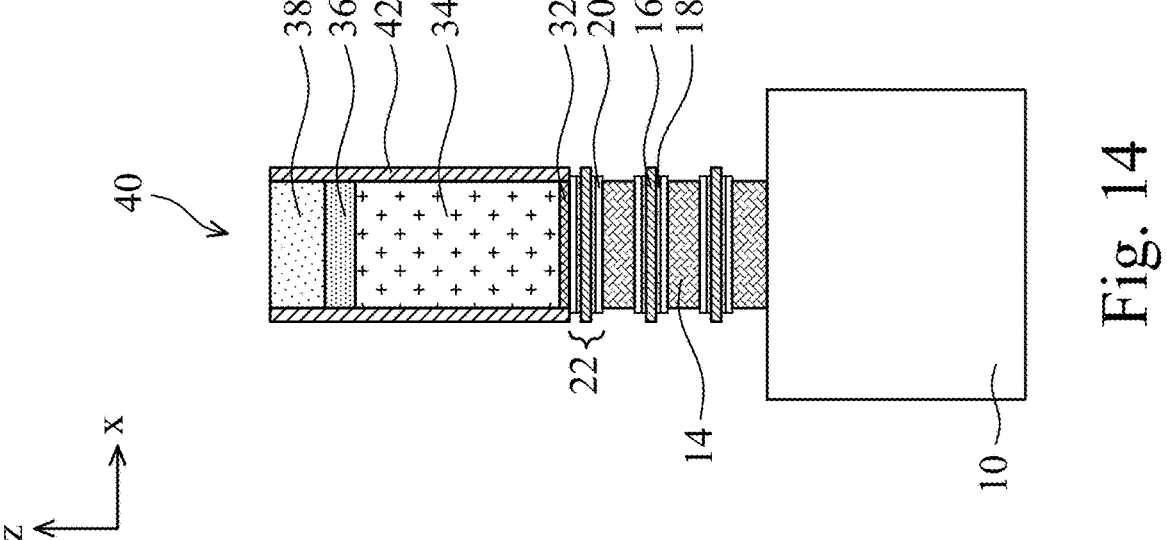
FIGS. 14, and 15A-B schematically illustrate various stages of manufacturing a semiconductor device according to another embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 64 degrees or at other orientations) and the spatially relative descriptors used herein may likewise be interpreted accordingly.

The foregoing broadly outlines some aspects of embodiments described in this disclosure. While some embodiments described herein are described in the context of nanosheet channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In addition, although method embodiments may be described in a particular order, various other method embodiments may be performed in any logical order and may include fewer or more steps than what is described herein. In the present disclosure, a source/drain refers to a source and/or a drain. A source and a drain are interchangeably used.

In multi-channel transistors, such as nanosheet FETs, two or more nanosheet channels are formed between source and drain. During operation, an electric current (transistor drive current) flow through the two or more nanosheet channels connecting the source and drain. The amount of drive current developed for a given bias voltage is a function of, among others, the mobility of the material used to form the channel region. Conventionally, nanosheet channels are typically formed from a semiconductor material, such as silicon, germanium, compound semiconductor, or alloy semiconductors. However, scaling down of the semiconductor nanosheet channels is constrained by the mobility of the semiconductor being used. According to embodiments of the present disclosure, channels in a transistor is formed by a two-dimensional (2D) material. Because two-dimensional (2D) materials have higher mobilities than semiconductor materials, compared to nanosheet channels made of semiconductor materials, nanosheet channels including two-dimensional (2D) materials can achieve the same drive current at smaller dimensions. The nanosheet channels according to the present disclosure can be formed ultra-thin, e.g. with sub-nanometer thickness.

In some embodiments, two-dimensional (2D) material nanosheets can be formed by alternately depositing a sacrificial channel layer and a channel stack containing two-dimensional (2D) material, and removing the sacrificial channel layer. In some embodiments, the channel stack includes a layer of two-dimensional (2D) material. In some embodiments, the channel stack includes a two-dimensional (2D) material layer and two interfacial layers, the two-dimensional (2D) material layer is sandwiched between the two interfacial layers. In some embodiments, the channel stack includes a two-dimensional (2D) material layer, two interfacial layers, and two high-k dielectric layers, the two-dimensional (2D) material layer is sandwiched between the two interfacial layers, and the two high-k dielectric layers are formed above and below the two interfacial layers.

The two-dimensional (2D) material nanosheet channels may be used in n-type devices, such as nFET, or p-type devices, such as pFET. In some embodiments, the two-dimensional (2D) material nanosheet channels are used in the pFET in a complementary metal oxide semiconductor (CMOS) device while the nFET in the CMOS device using semiconductor nanosheet channels to achieve N/P balance in the CMOS device.

FIG. 1 is a flow chart of a method for manufacturing of a semiconductor device according to embodiments of the present disclosure. FIGS. 2 to 4, and FIGS. 5A-B to FIGS. 11A-B schematically illustrate various stages of manufacturing a semiconductor device according to the method 100. Additional operations can be provided before, during, and after operations/processes in the method 100, and some of the operations described below can be replaced or eliminated, for additional embodiments of the method. The order of the operations/processes may be interchangeable.

The method 100 begins at operation 102, a sacrificial channel layer 14 is formed over a substrate 10. In operation 104, a channel stack 22 is deposited over the sacrificial channel layer 14. Operations 102 and 104 may be performed repeatedly to form two or more pairs of the sacrificial channel layer 14 and the channel stack 22, as shown in FIG. 2.

In FIG. 2, the substrate 10 is provided to form a semiconductor device thereon. The substrate 10 may include a single crystalline semiconductor material such as, but not limited to Si, Ge, SiGe, GaAs, InSb, GaP, GaSb, InAlAs, InGaAs, GaSbP, GaAsSb, and InP. The substrate 10 may include various doping configurations depending on circuit design. For example, different doping profiles, e.g., n-wells, p-wells, may be formed in the substrate 10 in regions designed for different device types, such as nFET and pFET. In some embodiments, the substrate 10 may be a silicon-on-insulator (SOI) substrate including an insulator structure (not shown) for enhancement.

In operation 102, the sacrificial channel layer 14 is deposited over the substrate 10. The sacrificial channel layer 14 may include a dielectric material, a semiconductor material, a metal, a metal oxide, or any material having etching selectivity with materials in the channel stack 22. In some embodiments, the sacrificial channel layer 14 is silicone dioxide ($SiO_2$) (or BN) deposited by atomic layer deposition (ALD) or chemical vapor deposition (CVD). The sacrificial channel layer 14 includes a suitable material that causes a sufficient etch selectivity to the channel stack 22. In other embodiments, the sacrificial channel layer 14 is a metal, such as Cu, Ni, etc or a metal oxide, such as $Al_2O_3$, $HfO_2$ etc. In some embodiments, the sacrificial channel layer 14 is a semiconductor material, such as SiGe, Si.

The sacrificial channel layer 14 may eventually be removed and serve to define a vertical distance between adjacent channels or a subsequently formed multi-gate device, such as a nanosheet GAA device. In some embodiments, the thickness of the sacrificial channel layer 14 is in a range between about 5 nm and about 50 nm.

In operation 104, a channel stack 22 is deposited over the sacrificial channel layer 14. Each channel stack 22 may include one or more layers of a channel region in a subsequently formed multi-gate device, such as a nanosheet GAA device. The embodiment shown in FIG. 2, the channel stack 22 includes a two-dimensional (2D) material layer 16, two interfacial layers 18, and two high-k dielectric layers 20. The two-dimensional (2D) material layer 16 is sandwiched between the two interfacial layers 18. The two high-k dielectric layers 20 are formed immediately above and below the two interfacial layers 18. The two interfacial layers 18 have substantially the same thickness. The two high-k dielectric layers 20 have substantially the same thickness. During operation, channel stack 22 is formed by sequentially depositing one high-k dielectric layer 20, one interfacial layer 18, one two-dimensional (2D) material layer 16, one interfacial layer 18, and one high-k dielectric layer 20.

In some embodiments, the channel stack 22 remains in a subsequently formed device. A gate electrode layer is to be formed over two high-k dielectric layers 20 forming a gate region substantially around the two-dimensional (2D) material layer 16.

In some embodiments, the two-dimensional (2D) material layer 16 may include a layer of two-dimensional (2D) materials, for example graphene, transition metal dichalcogenides (TMDs in the form of $MetalX_2$), such as $WS_2$, $WFe_2$, $MoS_2$, $MoSe_2$, $WSe_2$, $MoTe_2$, $WTe_2$, or a combination thereof. Generally, two-dimensional (2D) materials are monolayers of material held together by chemical bonds. The two-dimensional (2D) material layer 16 comprising individual monolayers stacked upon each other. In some embodiments, the two-dimensional (2D) material layer 16 may include individual monolayers of graphene, and/or TMDs, stacked together.

The two-dimensional (2D) material layer 16 is formed using a suitable deposition process, for example, chemical vapor deposition (CVD), atmospheric pressure CVD (APCVD), low-pressure CVD (LPCVD) at a sub-atmospheric pressure, plasma enhanced CVD (PECVD), atomic layer CVD (ALCVD), or combinations thereof.

In some embodiments, the two-dimensional (2D) material layer 16 includes monolayers of graphene formed by a CVD process used to deposit a carbon species. In some embodiments, the two-dimensional (2D) material layer 16 includes monolayers of graphene formed by reacting methane ($CH_4$) and hydrogen ($H_2$), using Argon (Ar) as carrier gas. In other embodiments, the two-dimensional (2D) material layer 16 includes monolayers of graphene formed by dissociation of carbon atoms. In some embodiments, monolayers of graphene may be doped with nitrogen to increase charge carriers for p-type devices. In some embodiments, nitrogen doping may be performed using a CVD process by mixing ammonia ($NH_3$) with methane ($CH_4$) as a precursor gas. In other embodiments, inducing charge carriers to the graphene layer is performed by the adsorption of various gases including $NH_3$, $H_2O$, $NO_2$, and the like. In some embodiments, monolayers of graphene may be doped with potassium for n-type devices.

In some embodiments, the two-dimensional (2D) material layer 16 includes monolayers of TMDs (MetalX$_2$) formed by APCVD process using the metal oxide or metal halide or metal organic and X containing precursors. Other materials and processes may be used to form the two-dimensional (2D) material layer 16.

As discussed above, compared to conventional semiconductor channels, the two-dimensional (2D) material layer 16 is ultra-thin. In some embodiments, the thickness T2 of the two-dimensional (2D) material layer 16 may be less than about 2 nm. For example, the thickness T2 may be in a range between 5 angstroms and 1 nm. A thickness less than 5 angstroms may not provide enough carrier to achieve desired drive current or enough structural stability to sustain the subsequent processes. A thickness more than 2 nm may increase dimension of the device without additional advantages.

The interfacial layer 18 functions to provide bonding between the two-dimensional (2D) material layer 16 and gate dielectric layer, such as the high-k dielectric layer 20. The interfacial layer 18 also provide a substantially dangling bonds free interface between the high-k dielectric layer 20 and the two-dimensional (2D) material layer 16.

In some embodiments, the interfacial layer 18 may include a boron nitride (BN), such as hexagonal boron nitride (h-BN), amorphous boron nitride (a-BN), or the like. The interfacial layer 18 can be deposited using the ALD or CVD processes.

In some embodiments, the thickness T3 of the interfacial layer 18 may be in a range between 5 angstroms and 1 nm. A thickness less than 5 angstroms may not provide enough bonding and isolation function. A thickness more than 1 nm may increase dimension of the device without additional advantages.

The high-k dielectric layer 20 functions as a gate dielectric layer in a subsequently formed device. The high-k dielectric layer 20 may be formed from any suitable dielectric materials. For example, the high-k dielectric layer 20 may include aluminum oxide ($Al_2O_3$), hafnium oxide ($HfO_2$), hafnium silicate (HfSiO), hafnium silicon oxynitride (HfSiON), hafnium tantalum oxide (HfTaO), hafnium titanium oxide (HfTiO), hafnium zirconium oxide (HfZrO), zirconium dioxide ($ZrO_2$), titanium oxide ($TiO_2$), hafnium dioxide-alumina ($HfO_2$—$Al_2O_3$) alloy, other suitable high-k dielectric materials, and/or combinations thereof.

The high-k dielectric layer 20 may be formed by CVD, ALD or any suitable method. In some embodiments, the thickness T4 of the high-k dielectric layer 20 is in a range between about 1 nm and about 3 nm.

In some embodiments, the operations 102 and 104 may be performed cyclically to form two or more pairs of the sacrificial channel layer 14 and the channel stack 22. In the embodiments of FIG. 2, three pairs of the sacrificial channel layer 14 and the channel stack 22 are formed. More or less pairs of the sacrificial channel layer 14 and the channel stack 22 may be included depending on the desired number of channels in the semiconductor device to be formed. In some embodiments, the number of pairs of the sacrificial channel layer 14 and the channel stack 22 is between 1 and 10.

In operation 106, a fin structure 28 is formed by etching through the pairs of the sacrificial channel layer 14 and the channel stack 22, and a portion of the substrate 10, as shown in FIG. 3. The fin structure 28 may be formed by patterning a pad layer 24 and a hard mask 26 formed on the pairs of the sacrificial channel layer 14 and the channel stack 22.

In operation 108, an isolation layer 30 is formed in trenches between the fin structures 28, as shown in FIG. 4. The isolation layer 30 is formed over the substrate 10 to cover at least a part of the fin structure 28. The isolation layer 30 may be formed by a high density plasma chemical vapor deposition (HDP-CVD), a flowable CVD (FCVD), or other suitable deposition process. In some embodiments, the isolation layer 30 may include silicon oxide, silicon nitride, silicon oxynitride, fluorine-doped silicate glass (FSG), a low-k dielectric, combinations thereof. In some embodiments, the isolation layer 30 is formed to cover the fin structure 28 by a suitable deposition process to fill the trenches between the fin structures 28, and then recess etched using a suitable anisotropic etching process to expose the pairs of the sacrificial channel layer 14 and the channel stack 22.

In operation 110, a sacrificial gate structure 40 is formed over the fin structure 28 and the isolation layer 30, as shown in FIG. 4. After the isolation layer 30 recessed etched, the pad layer 24 and hard mask 26 may be removed, and the sacrificial gate structure 40 is formed over a portion of the fin structure 28 which is to be a channel region. The sacrificial gate structure 40 may include a sacrificial gate dielectric layer 32, a sacrificial gate electrode layer 34, a pad layer 36, and a mask layer 38.

The sacrificial gate dielectric layer 32 may be formed conformally over the fin structure 28 and the isolation layer 30. In some embodiments, the sacrificial gate dielectric layer 32 may be deposited by a CVD process, a sub-atmospheric CVD (SACVD) process, a FCVD process, an ALD process, a PVD process, or other suitable process. The sacrificial gate dielectric layer 32 may include one or more layers of dielectric material, such as $SiO_2$, SiN, a high-k dielectric material, and/or other suitable dielectric material. In some embodiments, the sacrificial gate dielectric layer 32 includes a material different than that of the high-k dielectric layer 20.

The sacrificial gate electrode layer 34 may be blanket deposited on the sacrificial gate dielectric layer 32. The sacrificial gate electrode layer 34 includes silicon such as polycrystalline silicon or amorphous silicon. In some embodiments, the sacrificial gate electrode layer 34 is subjected to a planarization operation. The sacrificial gate electrode layer 34 may be deposited using CVD, including LPCVD and PECVD, PVD, ALD, or other suitable process.

Subsequently, the pad layer 36 and the mask layer 38 are formed over the sacrificial gate electrode layer 34. The pad layer 36 may include silicon nitride. The mask layer 38 may include silicon oxide. Next, a patterning operation is performed on the mask layer 38, the pad layer 36, the sacrificial gate electrode layer 34 and the sacrificial gate dielectric layer 32 to form the sacrificial gate structure 40.

In operation 112, sidewall spacers 42 are formed on sidewalls of each sacrificial gate structure 40, as shown in FIG. 4. After the sacrificial gate structure 40 is formed, the sidewall spacers 42 are formed by a blanket deposition of an insulating material followed by an anisotropic etch to remove insulating material from horizontal surfaces. In some embodiments, the insulating material of the sidewall spacers 42 is a silicon nitride-based material, such as SiN, SiON, SiOCN or SiCN and combinations thereof.

Lines A-A and B-B in FIG. 4 indicate cut lines of various views in FIGS. 5A-B to FIGS. 11A-B described below. Particularly, FIGS. 5A-11A are schematic cross-sectional views along lines A-A in FIG. 4, and FIGS. 5B-11B are schematic cross-sectional views along lines B-B in FIG. 4.

In operation 114, the fin structure 28 is recess etched to remove portions on both sides of the sacrificial gate structure 40, as shown in FIG. 5A-5B. In some embodiments, suitable dry etching and/or wet etching may be used to remove the pairs of the sacrificial channel layer 14 and the channel stack 22, together or separately. In some embodiments, the recess etch is performed to expose the substrate 10 below the pairs of the sacrificial channel layer 14 and the channel stack 22.

In operation 116, sacrificial source/drain features 44 are formed on both sides of the sacrificial gate structure 40, as shown in FIGS. 6A-6B. The sacrificial source/drain features 44 function to anchor the channel region of the fin structure 28 during gate process. The sacrificial source/drain features 44 may be formed from a dielectric material, such as $SiO_2$, a metal oxide, such as $Al_2O_3$, a semiconductor material, such as SiGe. The sacrificial source/drain features 44 may be formed using a deposition process, such as CVD, epitaxial growth, or other suitable process.

In operation 118, the sacrificial gate electrode layer 34 and sacrificial gate dielectric layer 32 are removed to expose the fin structure 28 covered by the sacrificial gate structure 40, or the fin structure 28 intended to be the channel region, as shown FIGS. 7A-7B. The sacrificial gate electrode layer 34 can be removed using plasma dry etching and/or wet etching. When the sacrificial gate electrode layer 34 is polysilicon, a wet etchant such as a tetramethylammonium hydroxide (TMAH) solution can be used to selectively remove the sacrificial gate electrode layer 34 without removing the materials in the sacrificial source/drain features 44.

After removal of the sacrificial gate electrode layer 34, the sacrificial gate dielectric layer 32 is exposed. An etch process may be performed to selectively remove the sacrificial gate dielectric layer 32 exposing the high-k dielectric layer 20, the interfacial layer 18, the two-dimensional (2D) material layer 16, and the sacrificial channel layer 14.

In operation 120, the sacrificial channel layers 14 are partially removed to expose the channel stacks 22 and form nanosheets, as shown in FIGS. 8A-8B. A suitable etching method may be used to selectively etch the sacrificial channel layers 14 while the high-k dielectric layer 20, the interfacial layer 18, the two-dimensional (2D) material layer 16 in the channel stacks 22 are substantially intact. The sacrificial channel layers 14 can be selectively etched using a suitable wet etchant or a dry etching process. In some embodiments, a dry etching process may be performed etching gases including fluorocarbon gas, such as $CF_4$, $C_2F_6$, $C_3F_8$, $CHF_3$, or $CH_2F_2$, to selectively remove the sacrificial channel layers 14.

According to embodiments of the present disclosure, end portions 14a of the sacrificial channel layers 14 remain after operation 120, as shown in FIGS. 8A-8B. The end portions 14a of the sacrificial channel layers 14 function as inner spacers in a subsequently formed device.

In operation 122, a gate electrode layer 46 is formed around the exposed channel stacks 22, as shown in FIGS. 9A-9B. The gate electrode layer 46 is formed around the channel stacks 22. The gate electrode layer 46 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof.

In some embodiments, the gate electrode layer 46 may be formed by CVD, ALD, electro-plating, or other suitable method. After the formation of the gate electrode layer 46, a planarization process, such as a CMP process, is performed to remove excess deposition of the gate electrode material and expose the top surface of the sacrificial source/drain features 44.

In operation 124, the sacrificial source/drain features 44 are removed so that replacement source/drain features 48 can be formed, as shown in FIGS. 10A-10B. The sacrificial source/drain features 44 can be removed using a suitable etching method. After removal of the sacrificial source/drain features 44, sides of the channel stacks 22 and the end portions 14a of the sacrificial channel layers 14 are exposed.

In operation 126, a metallic material may be deposited in cavities of the sacrificial source/drain features 44 to form the replacement source/drain features 48, as shown in FIGS. 10A-10B. The replacement source/drain features 48 may be formed on the substrate 10 to be in contact with the sides of the channel stacks 22 and the end portions 14a of the sacrificial channel layers 14.

In some embodiments, the replacement source/drain features 48 may include a metal, such as Ti, Co, Ni, W, Pt, Ta, Pd, Mo, AI, Bi, Ru, Sc, Cr and other suitable metal. In some embodiments, the replacement source/drain features 48 may be bi-metal materials, for example may be stacks of Ti/W, Ti/Co, Ti/Mo, or the like.

The replacement source/drain features 48 may be formed in any suitable methods, such as PVD, CVD, ALD, or other methods. In some embodiments, the replacement source/drain features 48 are formed by a temperature lower than about 600° C. to prevent work function shift of the gate electrode layer 46 or minimize metal diffusion or to reduce the strain loss from source/drain features 48

The replacement source/drain features 48 may be formed at a height that passes the topmost channel stack 22. In some embodiments, an interlayer dielectric (ILD) layer 50 is formed over the replacement source/drain features 48. A CMP process may be performed to remove excessive ILD material and expose the gate electrode layer 46.

As shown in FIG. 10A, side surfaces 16s of each two-dimensional (2D) material layer 16 are in contact with the replacement source/drain features 48 forming a transistor with the two-dimensional (2D) material layers 16 as channels carrying charges between the replacement source/drain features 48.

In operation 128, a gate contact 52 and source/drain contacts 54 are formed as shown in FIGS. 11A-11B. In some embodiments, the gate electrode layer 46 is recessed using any suitable process, such as a dry etch, a wet etch, or a combination thereof. A self-aligned contact layer 56 is formed over the gate electrode layer 46 between the sidewall spacers 42. The self-aligned contact layer 56 may be formed by a blanket deposition process, followed by a CMP process to the level of the sidewall spacers 42 to remove excessive materials over the sidewall spacers 42, then selectively recessed to form trenches between the sidewall spacers 42 and above the self-aligned contact layer 56. A hard mask layer 58 is then formed over the dielectric self-aligned contact layer 56. Contact holes may be formed by any suitable process in the hard mask layer 58 and the self-aligned contact layer 56. Subsequently, a conductive material layer fills in the contact holes to form the gate contacts 52. Similarly, contact holes may be formed through the ILD layer 50 and subsequently filled with a conductive material to form the source/drain contacts 54. Suitable photolithographic and etching techniques are used to form the contact holes through various layers. After formation of the gate contacts 52 and source/drain contacts 54, interconnect structure (not shown) is formed to further connect the replacement source/drain features 48 and the gate electrode layer 46 to a power rail or signal lines.

FIGS. 12-13 schematically illustrate various stages of manufacturing a semiconductor device according to another embodiment of the present disclosure. FIGS. 12 and 13 are schematic cross-sectional views along line A-A in FIG. 4.

The semiconductor device shown in FIGS. 12-13 is similar to the semiconductor device of FIGS. 2-11, except that inner spacers 60 are formed between the gate electrode layer 46 and the replacement source/drain features 48. The inner spacers 60 can be used when the sacrificial channel layers 14 are formed from materials not suitable to serve as spacers between the gate electrode layer 46 and the replacement source/drain features 48. For example, when the sacrificial channel layers 14 include semiconductor materials, such as SiGe, the inner spacers 60 may be formed from a dielectric material.

The semiconductor device shown in FIGS. 12-13 can be formed by a method similar to the method 100 except that an operation of forming the inner spacers 60 is added. In some embodiments, the inner spacer 60 are formed after recess etch in operation 114, as shown in FIGS. 5A-5B, and prior to formation of the sacrificial source/drain features 44 in operation 116, as shown in FIGS. 6A-6B.

The inner spacers 60 may be formed by selectively etching the sacrificial channel layers 14 to form spacer cavities between the channel stacks 22, forming an insulating layer by a blanket deposition, then etching back the insulating layer to leave the insulating layer in the spacer cavities as the inner spacers 60. The spacer cavities can be formed by selectively etching the sacrificial channel layers 14 using a suitable wet etchant or a dry etching process. In some embodiments, the sacrificial channel layers 14 can be selectively etched by using a wet etchant such as, but not limited to, ammonium hydroxide ($NH_4OH$), tetramethylammonium hydroxide (TMAH), ethylenediamine pyrocatechol (EDP), or potassium hydroxide (KOH) solutions. The insulating layer can be formed by ALD or any other suitable method. The subsequent etch process removes most of the insulating layer except inside the cavities, resulting in the inner spacers 60. In some embodiments, the inner spacers 60 may include one of silicon nitride (SiN) and silicon oxide ($SiO_2$), SiONC, or a combination thereof.

FIGS. 14, and 15A-B schematically illustrate various stages of manufacturing a semiconductor device according to another embodiment of the present disclosure. FIGS. 14 and 15A are schematic cross-sectional views along line A-A in FIG. 4. FIG. 15B is a partial enlarge view of FIG. 15A.

The semiconductor device shown in FIGS. 14 and 15A-B is similar to the semiconductor device of FIGS. 2-11, except that the interfacial layers 18 and the high-k dielectric layers 20 are etched back so that each of the two-dimensional (2D) material layers 16 contacts the replacement source/drain features 48 on three surfaces. The semiconductor device shown in FIGS. 14 and 15A-B can be formed by a method similar to the method 100 except that an operation of etching back the interfacial layers 18 and the high-k dielectric layers 20 is added. In some embodiments, the interfacial layers 18 and the high-k dielectric layers 20 are etched back after recess etch in operation 114, as shown in FIGS. 5A-5B, and prior to formation of the sacrificial source/drain features 44 in operation 116 as shown in FIGS. 6A-6B. In other embodiments, the interfacial layers 18 and the high-k dielectric layers 20 are etched back after removal of the sacrificial source/drain features 44 in operation 124, and prior to depositing the replacement source/drain features 48 in operation 126.

As shown in FIG. 14, end portion 16e of the two-dimensional (2D) material layers 16 are exposed by selectively etching the interfacial layers 18 and the high-k dielectric layers 20 using a suitable wet etchant or a dry etching process. The interfacial layers 18 and the high-k dielectric layers 20 may be etched together in one etching process or in two steps using different etching chemistry. In some embodiments, a wet etching process using wet etchant including $NH_4OH$, and $H_2O_2$ may be used to selectively etch back the interfacial layers 18 and the high-k dielectric layers 20.

As shown in FIG. 15B, each end portion 16e of a two-dimensional (2D) material layer 16 contacts the replacement source/drain feature 48 on a top surface 16t, a side surface 16s, and a bottom surface surfaces 16b. The increase of contact areas between the channel region and the source/drain feature reduces the interface resistance, thus, increasing the device speed.

In some embodiments, the length L1 of the exposed end portion 16e is in a range between 5 angstroms and 2 nm. A length less than 5 angstroms may not provide enough benefit. A length greater than 2 nm may reduce effective channel length without providing additional advantages. In some embodiments, the ratio of the length L1 of the exposed end portion 16e over the thickness T2 of the two-dimensional (2D) material layer 16 may be between 0.5 and about 2. A ratio less than 0.5 may not provide enough benefit. A ratio greater than 2 may reduce effective channel length without providing additional advantages.

Figures 16, 17A, 17B:
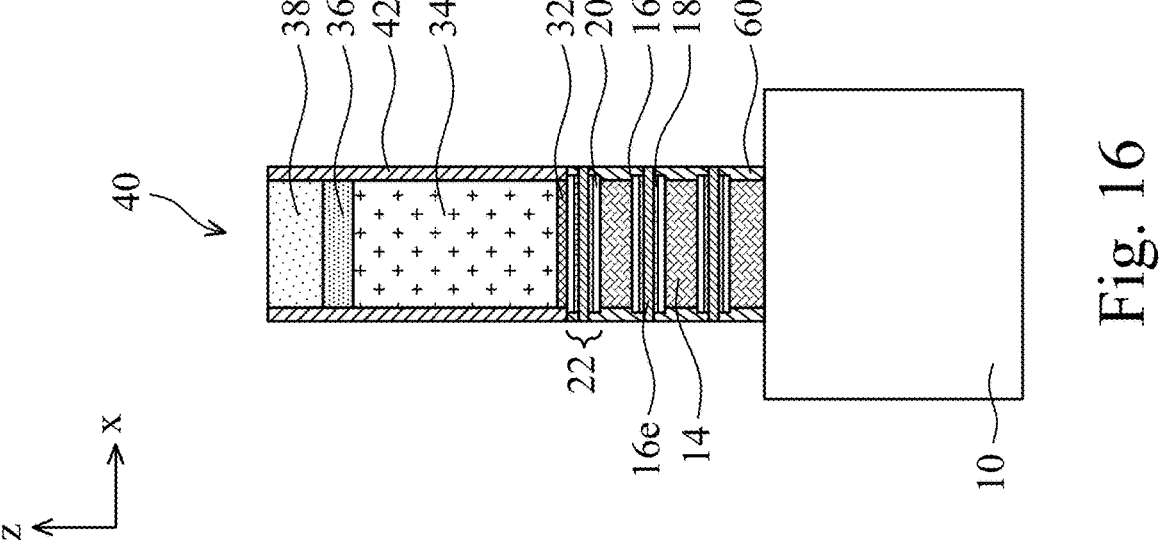
FIGS. 16, and 17A-B schematically illustrate various stages of manufacturing a semiconductor device according to another embodiment of the present disclosure.

FIGS. 16, and 17A-B schematically illustrate various stages of manufacturing a semiconductor device according to another embodiment of the present disclosure. FIGS. 16 and 17A are schematic cross-sectional views along line A-A in FIG. 4. FIG. 17B is a partial enlarge view of FIG. 17A.

The semiconductor device shown in FIGS. 16 and 17A-B is similar to the semiconductor device of FIGS. 2-11 except that inner spacers 60 are formed between the gate electrode layer 46 and the replacement source/drain features 48, and each of the two-dimensional (2D) material layers 16 contact the replacement source/drain features 48 on three surfaces. The semiconductor device shown in FIGS. 16 and 17A-B can be formed by a method similar to the method 100 except that an operation for etching back the interfacial layers 18 and the high-k dielectric layers 20 and an operation of forming the inner spacers 60 are added. In some embodiments, the inner spacers 60 are formed after the sacrificial channel layers 14, the interfacial layers 18 and the high-k dielectric layers 20 are etched back. Etching back of the layers and inner spacers 60 formation may be performed using operations similar to those described in FIGS. 12-13 and 14-15.

In some embodiments, the sacrificial channel layers 14 are etched more than the interfacial layers 18 and the high-k dielectric layers 20. The inner spacers 60 may also position between the replacement source/drain features 48 and the interfacial layer 18 and high-k dielectric layers 20, therefore providing additional insulation between the gate stack and the source/drain features in the subsequently formed semiconductor device.

FIG. 18 and FIGS. 19A-B to 22A-B schematically illustrate various stages of manufacturing a semiconductor device according to some embodiments of the present disclosure. Lines A-A and B-B in FIG. 18 indicate cut lines of various views in FIGS. 19A-B to FIGS. 22A-B described below. Particularly, FIGS. 19A-22A are schematic cross-sectional views along lines A-A in FIG. 18, and FIGS. 19B-22B are schematic cross-sectional views along lines B-B in FIG. 18.

In FIG. 18 and FIGS. 19A-B to 22A-B, the semiconductor device is manufactured from alternately depositing two or more sacrificial channel layers 14 and two or more two-dimensional (2D) material layers 16. Instead of using the channel stacks 22 including two interfacial layers 18, two high-k dielectric layers 20, and one two-dimensional (2D) material layer 16, as described in the embodiments of FIGS. 2-11, the channel stack in FIGS. 18-22 only includes one two-dimensional (2D) material layer 16. Interfacial layers and high-k dielectric layers are formed during replacement gate sequence.

Figure 18:
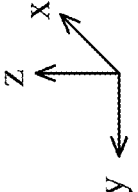

In FIG. 18, the substrate 10 is provided to form a semiconductor device thereon. Sacrificial channel layers 14 and two-dimensional (2D) material layers 16 are alternately deposited on the substrate 10. The sacrificial channel layers 14 may be formed as described above in operation 102. The two-dimensional (2D) material layers 16 may be formed as describe in operation 104. In some embodiments, each two-dimensional (2D) material layer 16 is sandwiched between two sacrificial channel layers 14. In some embodiments, the thickness of the sacrificial channel layers 14 may be different for the topmost and lowermost layer to provide space allowance for layers to be formed subsequently.

The sacrificial channel layer 14 may be a dielectric material, a semiconductor material, a metal, a metal oxide, or any material having etching selectivity of with materials in the two-dimensional (2D) material layers 16. The two-dimensional (2D) material layer 16 may include a layer of two-dimensional (2D) materials, for example graphene, transition metal dichalcogenides (TMDs in the form of MetalX$_2$), such as WS$_2$, WFe$_2$, MoS$_2$, MoSe$_2$, WSe$_2$, MoTe$_2$, WTe$_2$, or a combination thereof.

After formation of the film stacks with alternating sacrificial channel layers 14 and the two-dimensional (2D) material layers 16, operations similar to the operations 106, 108, 110, 112, 114, and 116 of the method 100 may be performed to form fin structure, sacrificial gate structure 40, sidewall spacers 42, and sacrificial source/drain structures 44 as shown in FIGS. 19A and 19B. In some embodiments, the sacrificial channel layers 14 may be etched back to expose end portions 16e of two-dimensional (2D) material layers 16 so that the two-dimensional (2D) material layers 16 contact the replacement source/drain features 48 on three surfaces of the end portions 16e in the semiconductor device to be formed.

Figure 20B:
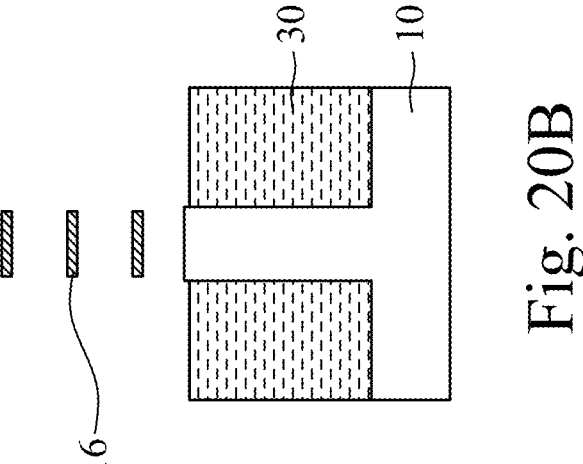
Figure 20A:
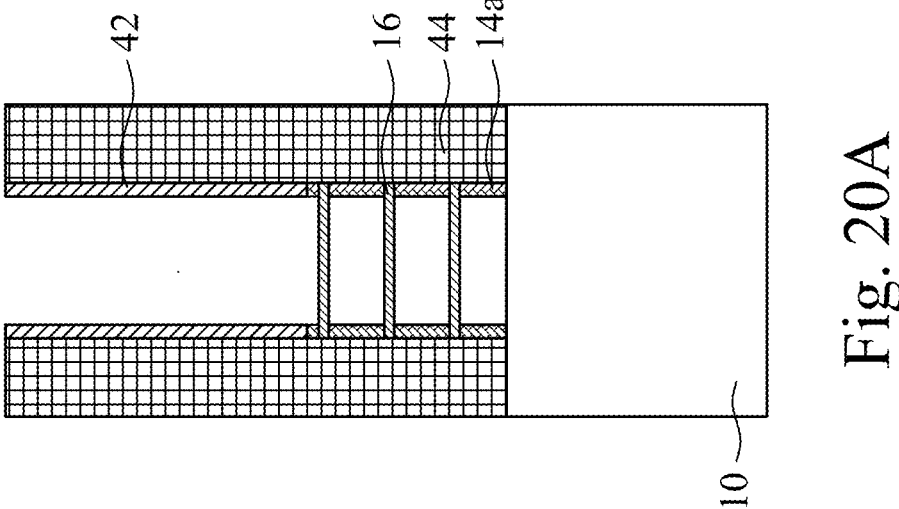

An operation similar to the operation 118 in the method 100 may then be performed to remove the sacrificial gate electrode layer 34 and sacrificial gate dielectric layer 32. An operation similar to the operation 120 in the method 100 may be performed to partially remove sacrificial channel layers 14. As shown in FIGS. 20A-20B, after partial removal of the sacrificial channel layers 14, the two-dimensional (2D) material layers 16 are exposed in the gate cavity forming nanosheets. End portions 14a of the sacrificial channel layers 14 remain and eventual function as inner spacers in a subsequently formed device.

In FIGS. 21A-21B, an interfacial layer 18', a high-k dielectric layer 20' and a gate electrode layer 46 are sequentially formed. In some embodiments, the interfacial layer 18' may include a boron nitride (BN), such as hexagonal boron nitride (h-BN), and amorphous boron nitride (a-BN), or the like. The interfacial layer 18 can be deposited using the ALD or CVD processes. In some embodiments, the thickness T3 of the interfacial layer 18 may be in a range between 5 angstroms and 1 nm. A thickness less than 5 angstroms may not provide enough bonding and isolation function. A thickness more than 1 nm may increase dimension of the device without additional advantages.

In some embodiments, the high-k dielectric layer 20' may be formed from any suitable dielectric materials. For example, the high-k dielectric layer 20' may include aluminum oxide (Al$_2$O$_3$), hafnium oxide (HfO$_2$), hafnium silicate (HfSiO), hafnium silicon oxynitride (HfSiON), hafnium tantalum oxide (HfTaO), hafnium titanium oxide (HfTiO), hafnium zirconium oxide (HfZrO), zirconium dioxide (ZrO$_2$), titanium oxide (TiO$_2$), hafnium dioxide-alumina (HfO$_2$—Al$_2$O$_3$) alloy, other suitable high-k dielectric materials, and/or combinations thereof. The high-k dielectric layer 20 may be formed by CVD, ALD or any suitable method. In some embodiments, the thickness T3 of the high-k dielectric layer 20' is in a range between about 1 nm and about 3 nm.

The gate electrode layer 46 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In some embodiments, the gate electrode layer 46 may be formed by CVD, ALD, electro-plating, or other suitable method.

As shown in FIG. 21B, the interfacial layer 18', the high-k dielectric layer 20' and the gate electrode layer 46 surround four sides of the two-dimensional (2D) material layer 16.

After the formation of the gate electrode layer 46, a planarization process, such as a CMP process, is performed to remove excess deposition of the gate electrode material and expose the top surface of the sacrificial source/drain features 44.

Operations similar to the operation 124, 126, and 128 in the method 100, may be performed to remove the sacrificial source/drain features 44, form the replacement source/drain features 48, gate contacts 52, and the source/drain contacts 54, as shown in FIGS. 22A-22B.

FIGS. 23A-B schematically illustrate various stages of manufacturing a semiconductor device according to another embodiment of the present disclosure. FIGS. 23A-B are schematic cross-sectional views along line A-A in FIG. 18.

The semiconductor device shown in FIGS. 23A-23B is similar to the semiconductor device of FIGS. 18 and FIGS. 19A-B to 22A-B, except inner spacers 60' are formed between the gate electrode layer 46 and the replacement source/drain features 48 in place of the end portions 14a of the sacrificial channel layer 14. In some embodiments, the inner spacers 60' are formed by etching back end portions of the sacrificial channel layers 14 to form spacer cavities around the end portions 16e of the two-dimensional (2D) material layers 16, depositing an insulation layer, and etching back the insulation layer. In some embodiments, the inner spacers 60' are used when the sacrificial channel layers 14 are formed from materials not suitable to serve as spacers between the gate electrode layer 46 and the replacement source/drain features 48. For example, when the sacrificial channel layers 14 include semiconductor materials, such as SiGe.

In some embodiments, side surfaces 60s' of the inner spacers 60' are substantially in line with side surfaces 16s of the two-dimensional (2D) material layers 16 to allow the two-dimensional (2D) material layers 16 in direct contact with the replacement source/drain features 48 via the side surfaces 16s. In some embodiments, side surfaces 60s' of the inner spacers 60' are etched further back to expose end portions 16e of the two-dimensional (2D) material layers 16 to allow the two-dimensional (2D) material layers 16 in direct contact with the replacement source/drain features 48 via three surfaces of the end portions 16e.

FIG. 24 and FIGS. 25A-B to FIGS. 28A-B schematically illustrate various stages of manufacturing a semiconductor device according to some embodiments of the present disclosure. Lines A-A and B-B in FIG. 24 indicate cut lines of various views in FIGS. 25A-B to FIGS. 28A-B described below. Particularly, FIGS. 25A-28A are schematic cross-sectional views along lines A-A in FIG. 24, and FIGS. 25B-28B are schematic cross-sectional views along lines B-B in FIG. 24.

In FIG. 24 and FIGS. 25A-B to 28A-B, the semiconductor device is manufactured from alternately depositing two or more sacrificial channel layers 14 and two or more channel stacks 22'. Instead of using the channel stacks 22 including the interfacial layers 18, the high-k dielectric layers 20, and one two-dimensional (2D) material layer 16, as described in the embodiments of FIGS. 2-11, the channel stack 22' in FIGS. 24-28 includes a two-dimensional (2D) material layer 16 sandwiched between two interfacial layers 18. High-k dielectric layers are formed during replacement gate sequence.

Figure 24:
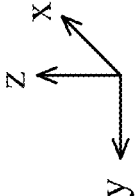

In FIG. 24, the substrate 10 is provided to form a semiconductor device thereon. Sacrificial channel layers 14 and the channel stacks 22' are alternately deposited on the substrate 10. The sacrificial channel layers 14 may be formed as described above in operation 102. The two-dimensional (2D) material layers 16 and the interfacial layers 18 may be formed as describe in operation 104.

The sacrificial channel layer 14 may be a dielectric material, a semiconductor material, a metal, a metal oxide, or any material with etch selectivity of with materials in the two-dimensional (2D) material layers 16 and the interfacial layers 18. The two-dimensional (2D) material layer 16 may include a layer of two-dimensional (2D) materials, for example graphene, transition metal dichalcogenides (TMDs in the form of MetalX$_2$), such as WS$_2$, WFe$_2$, MoS$_2$, MoSe$_2$, WSe$_2$, MoTe$_2$, WTe$_2$, or a combination thereof. In some embodiments, the interfacial layer 18 may include a boron nitride (BN), such as hexagonal boron nitride (h-BN), amorphous boron nitride (a-BN), or the like. The interfacial layer 18 can be deposited using the ALD or CVD processes.

After formation of the film stacks with alternating sacrificial channel layers 14 and the channel stacks 22', operations similar to the operations 106, 108, 110, 112, 114, and 116 of the method 100 may be performed to form fin structure, sacrificial gate structure 40, sidewall spacers 42, and sacrificial source/drain structures 44 as shown in FIGS. 25A and 25B.

An operation similar to the operation 118 in the method 100 may then be performed to remove the sacrificial gate electrode layer 34 and sacrificial gate dielectric layer 32. An operation similar to the operation 120 in the method 100 may be performed to partially remove sacrificial channel layers 14. As shown in FIGS. 26A-26B, after partial removal of the sacrificial channel layers 14, the channel stacks 22' are exposed in the gate cavity forming nanosheets. End portions 14a of the sacrificial channel layers 14 remain and eventual function as inner spacers in a subsequently formed device.

In FIGS. 27A-27B, a high-k dielectric layer 20' and a gate electrode layer 46 are sequentially formed. In some embodiments, the high-k dielectric layer 20' may be formed from any suitable dielectric materials. For example, the high-k dielectric layer 20' may include aluminum oxide (Al$_2$O$_3$), hafnium oxide (HfO$_2$), hafnium silicate (HfSiO), hafnium silicon oxynitride (HfSiON), hafnium tantalum oxide (HfTaO), hafnium titanium oxide (HfTiO), hafnium zirconium oxide (HfZrO), zirconium dioxide (ZrO$_2$), titanium oxide (TiO$_2$), hafnium dioxide-alumina (HfO$_2$—Al$_2$O$_3$) alloy, other suitable high-k dielectric materials, and/or combinations thereof. The high-k dielectric layer 20 may be formed by CVD, ALD or any suitable method. In some embodiments, the thickness T3 of the high-k dielectric layer 20' is in a range between about 1 nm and about 3 nm.

The gate electrode layer 46 includes one or more layers of conductive material, such as polysilicon, aluminum, copper, titanium, tantalum, tungsten, cobalt, molybdenum, tantalum nitride, nickel silicide, cobalt silicide, TiN, WN, TiAl, TiAlN, TaCN, TaC, TaSiN, metal alloys, other suitable materials, and/or combinations thereof. In some embodiments, the gate electrode layer 46 may be formed by CVD, ALD, electro-plating, or other suitable method.

As shown in FIG. 27B, the high-k dielectric layer 20' and the gate electrode layer 46 surround all sides of the channel stacks 22'.

After the formation of the gate electrode layer 46, a planarization process, such as a CMP process, is performed to remove excess deposition of the gate electrode material and expose the top surface of the sacrificial source/drain features 44.

Operations similar to the operation 124, 126, and 128 in the method 100, may be performed to remove the sacrificial source/drain features 44, form the replacement source/drain features 48, gate contacts 52, and the source/drain contacts 54, as shown in FIGS. 28A-28B.

FIGS. 29A-B schematically illustrate various stages of manufacturing a semiconductor device according to another embodiment of the present disclosure. FIGS. 29A-B are schematic cross-sectional views along line A-A in FIG. 24.

The semiconductor device shown in FIGS. 29A-29B is similar to the semiconductor device of FIGS. 24 and FIGS. 25A-B to 28A-B, except inner spacers 60" are formed between the gate electrode layer 46 and the replacement source/drain features 48 in place of the end portions 14a of the sacrificial channel layers 14. In some embodiments, the inner spacers 60" are formed by etching back end portions of the sacrificial channel layers 14 to form spacer cavities around the end portions of the channel stacks 22', depositing an insulation layer, and etching back the insulation layer. In some embodiments, the inner spacers 60' are used when the sacrificial channel layers 14 are formed from materials not suitable to serve as spacers between the gate electrode layer 46 and the source/drain features 48. For example, when the sacrificial channel layers 14 include semiconductor materials, such as SiGe.

In some embodiments, as shown in FIG. 29B, the inner spacers 60" are formed around the end portions of the channel stacks 22' and the two-dimensional (2D) material layers 16 are in direct contact with the replacement source/drain features 48 via the side surfaces 16s. In other embodiments, (not shown) end portions of interfacial layers 18 may be etched back prior to form the inner spacers 60" or prior to form the replacement source/drain features 48 to expose end portions 16e of the two-dimensional (2D) material layers 16 to allow the two-dimensional (2D) material layers 16 in direct contact with the replacement source/drain features 48 via three surfaces of the end portions 16e.

The two-dimensional (2D) material layer according to the present disclosure can be used as channel in n-type device or p-type device. In some embodiments, the two-dimensional (2D) material layers according to the present disclosure can be used in both n-type devices and p-type devices on a substrate where increased drive currents and/or reduced dimensions are desirable.

Semiconductor channel materials for n-type device typically have higher density of carriers than semiconductor channel material for p-type devices. As a result, p-type devices may have a larger dimension or a larger footprint than n-type devices with the same level of drive currents. In some embodiments, the two-dimensional (2D) channel layers are included in a portion of the semiconductor devices on a substrate to achieve balance among the devices so that different types of devices n the same substrate have comparable dimensions and drive current. For example, the two-dimensional (2D) material nanosheets may be used in pFET in a CMOSFET device so that the pFET in the CMOSFET achieves a drive current high enough to match the nFET in the CMOSFET.

Figure 30:
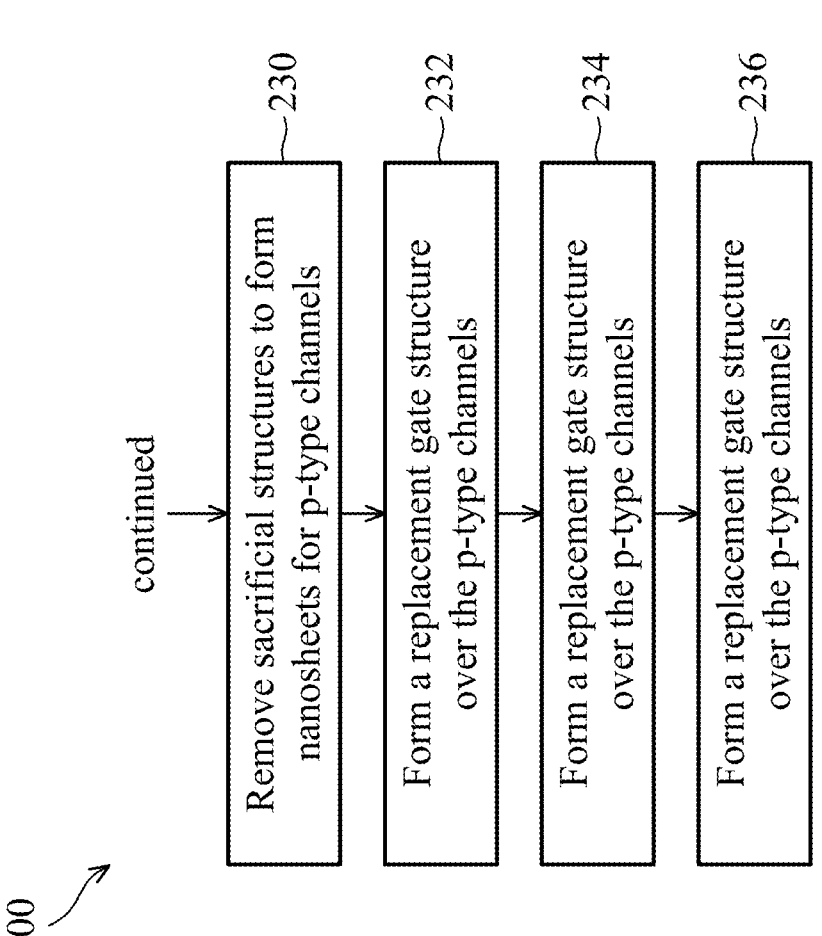
FIG. 30 is a flow chart of a method for manufacturing of a semiconductor device according to embodiments of the present disclosure.

FIG. 30 is a flow chart of a method 200 for manufacturing of a semiconductor device according to embodiments of the present disclosure. Particularly, the method 200 may be used to manufacture semiconductor devices including both n-type devices and p-type devices with balanced drive currents. FIGS. 31 to 34, and FIGS. 35A-C to FIGS. 43A-B schematically illustrate various stages of manufacturing a semiconductor device according to the method 200 of FIG. 30.

In the embodiment shown FIGS. 31 to 34, and FIGS. 35A-C to FIGS. 43A-B, the pFET is formed using operation similar to the embodiment described in FIGS. 2-11. However, other embodiments, such as the embodiments described in FIGS. 12-29, alone or in combination, may also be used.

Figure 31:
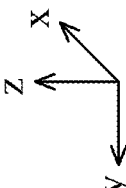

In operation 202 of the method 200, a film stack for n-type devices, which includes alternating sacrificial channel layers 14 and channel stacks 22, is deposited over a substrate 10 as shown in FIG. 31. In FIG. 31, the substrate 10 includes a p-doped region or p-well 11 and an n-doped region or n-well 12. One or more n-type devices, such as nFETs, are to be formed over and/or within p-well 11. One or more p-type devices, such as pFETs, are to be formed over and/or within n-well 12. FIG. 31 shows that the n-well 12 and the p-well 11 are formed adjacent to one another, which is not limiting. In other embodiments, the p-well 11 and the n-well 12 may be separated by one or more insulation bodies, e.g., shallow trench insulation ("STI"). The p-well 11 and n-well 12 in FIG. 31 are formed using a dual-tub process, in which both p-well 11 and n-well 12 are formed in the substrate 10. Other processes, like a p-well process in an n-type substrate or an n-well process in a p-type substrate are also possible and included in the disclosure. It is also possible that both p-well 11 and n-well 12 are intrinsic or intrinsically doped, e.g., unintentionally doped.

The sacrificial channel layers 14 and channel stacks 22 may be formed by processes similar to operations 102 and 104 of the method 100. In FIG. 31, the channel stacks 22 includes one two-dimensional (2D) material layer 16, two interfacial layers 18, and two high-k dielectric layer 20. In other embodiments, a channel stack with other configuration, such as a channel stack only one two-dimensional (2D) material layer 16, as in FIG. 18, or a channel stack including one two-dimensional (2D) material layer 16 sandwiched between two interfacial layers 18, as in FIG. 24, may be used.

In some embodiment, the film stack for p-type devices, which includes sacrificial channel layers 14 and channel stacks 22, may be formed by blanket depositions followed by a patterning process to remove films outside the n-well

12. In other embodiments, a patterning process may be performed first to expose the n-well 12 area, and the film stack is then formed thereon.

In operation 204, a semiconductor film stack 17 for n-type device is formed over the p-well 11. The semiconductor film stack 17 includes alternating semiconductor layers made of different materials to facilitate formation of nanosheet channels in a multi-gate n-type device, such as nanosheet channel nFETs. In some embodiments, the semiconductor film stack 17 includes first semiconductor layers 13 interposed by second semiconductor layers 15. The first semiconductor layers 13 and second semiconductor layers 15 have different compositions. In some embodiments, the two semiconductor layers 13 and 15 provide for different oxidation rates and/or different etch selectivity. In later fabrication stages, portions of the second semiconductor layers 15 form nanosheet channels in a multi-gate device. Three first semiconductor layers 13 and three second semiconductor layers 15 are alternately arranged as illustrated in FIG. 30 as an example. More or less semiconductor layers 13 and 15 may be included in the semiconductor film stack 17 depending on the desired number of channels in the semiconductor device to be formed. In some embodiments, the number of semiconductor layers 13 and 15 is between 1 and 10.

In some embodiments, the first semiconductor layer 13 may include silicon germanium (SiGe). The first semiconductor layer 13 may be a SiGe layer including more than 25% Ge in molar ratio. For example, the first semiconductor layer 13 may be a SiGe layer including Ge in a molar ration in a range between 25% and 50%. The second semiconductor layer 15 may include silicon (Si). In some embodiments, the second semiconductor layer 15 may include n-type dopants, such as phosphorus (P), arsenic (As), etc.

In some embodiments, the film stack for n-type devices may be formed by blanket depositions followed by a patterning process to remove films outside the p-well 11. In other embodiments, a patterning process may be performed first to expose the p-well 11 area, and the film stack is then formed thereon. In some embodiments, operation 204 may be performed prior to performing operation 202.

In FIG. 31, the height of the film stacks for the n-type device and p-type device is substantially the same. By using the two-dimensional (2D) material layers 16 in the p-type device, drive current of the p-type device to be formed is in balance with the drive current of the n-type device of the same dimension. In some embodiments, the number of channel stacks 22 equals to the number of the second semiconductor layers 15 in the semiconductor film stack 17, as shown in FIG. 31. In other embodiments, there are more channel stacks 22 in the p-type film stack than the first semiconductor layers 13 in the semiconductor film stack 17 because the two-dimensional (2D) material layers 16 are ultra-thin.

Figure 32:
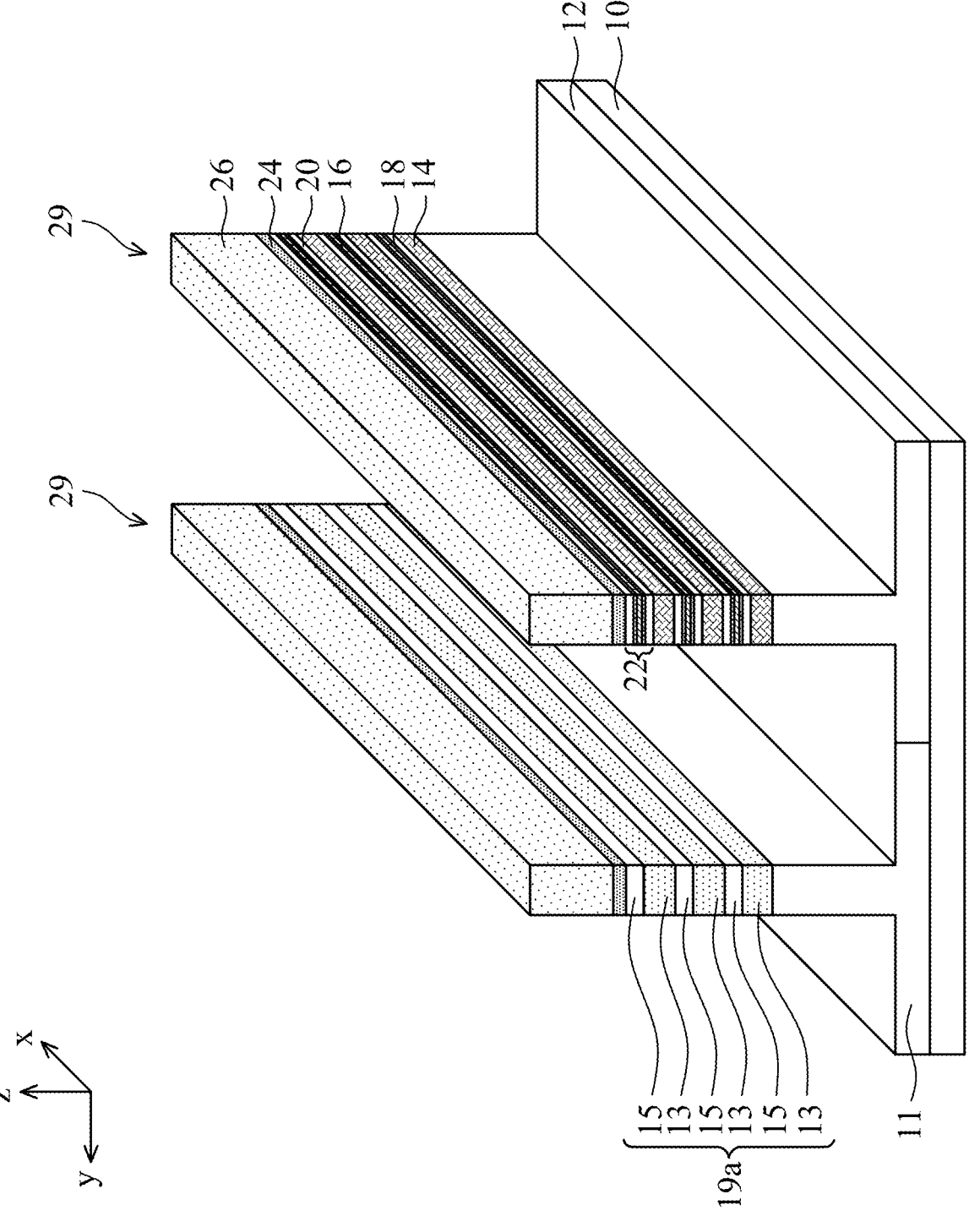

In operation 206, fin structures 28, 29 are formed using one or more patterning and etching processes, as shown in FIG. 32. The fin structures 28, 29 may be formed by patterning a pad layer 24 and a hard mask 26 formed on the pairs of the sacrificial channel layer 14 and the channel stack 22 and the semiconductor film stack 17. In some embodiments, the fin structures 28, 29 may be formed using separate etching process. In other embodiments, the fin structures 28, 29 are formed using the same etching process. In some embodiments, the fin structures 29, 28 includes a portion of the p-well 11, the n-well 12 underneath respectively.

Figure 33:
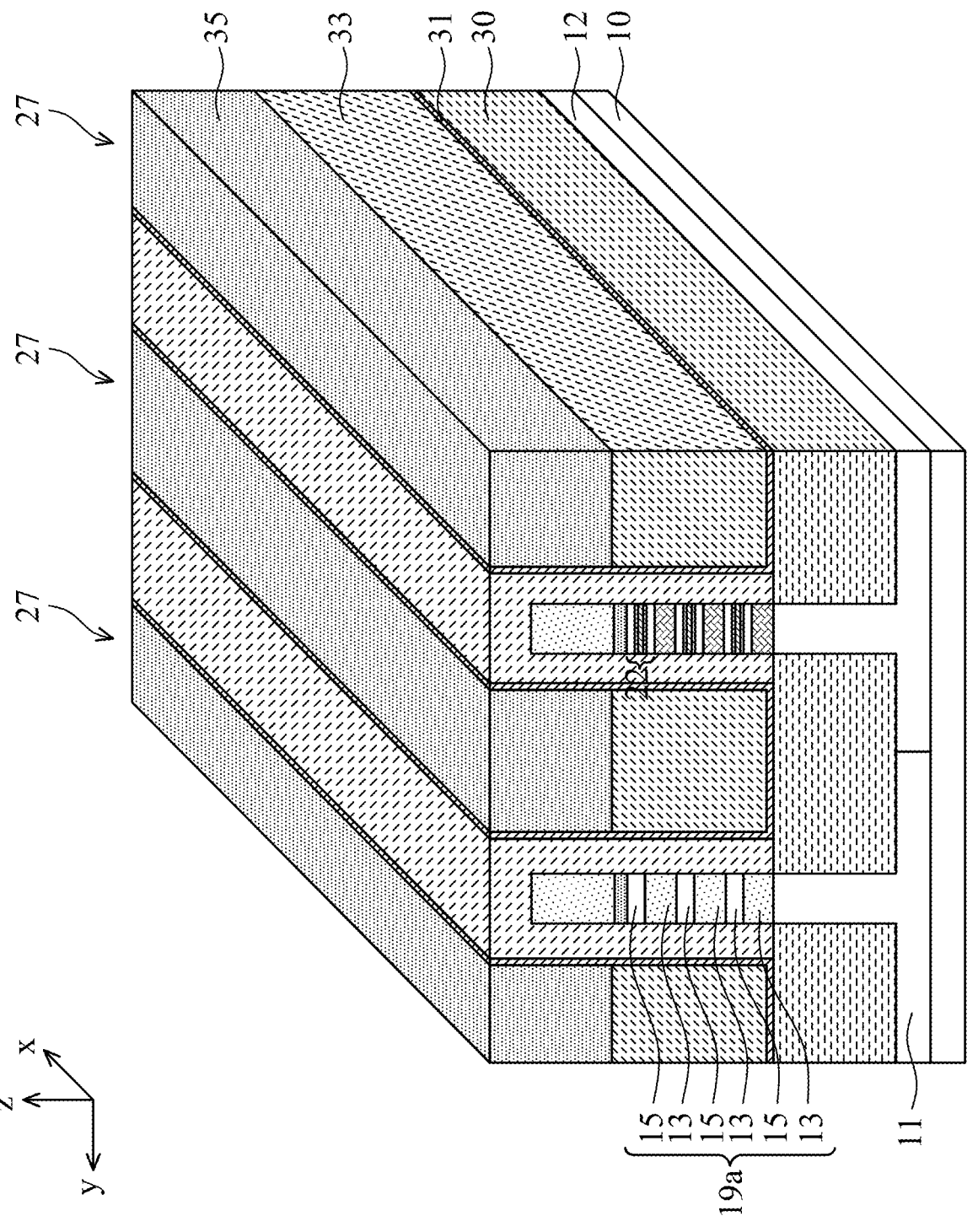

In operation 208, one or more hybrid fins 27 are formed between the neighboring fin structures 28, 29 as shown in FIG. 33. In some embodiments, the hybrid fins 27 may be formed by sequentially depositing an isolation layer 30, a dielectric liner 31, a low-k dielectric layer 33, and a high-k dielectric layer 35 to fill up the trenches between the fin structures 28, 29.

Figure 34:
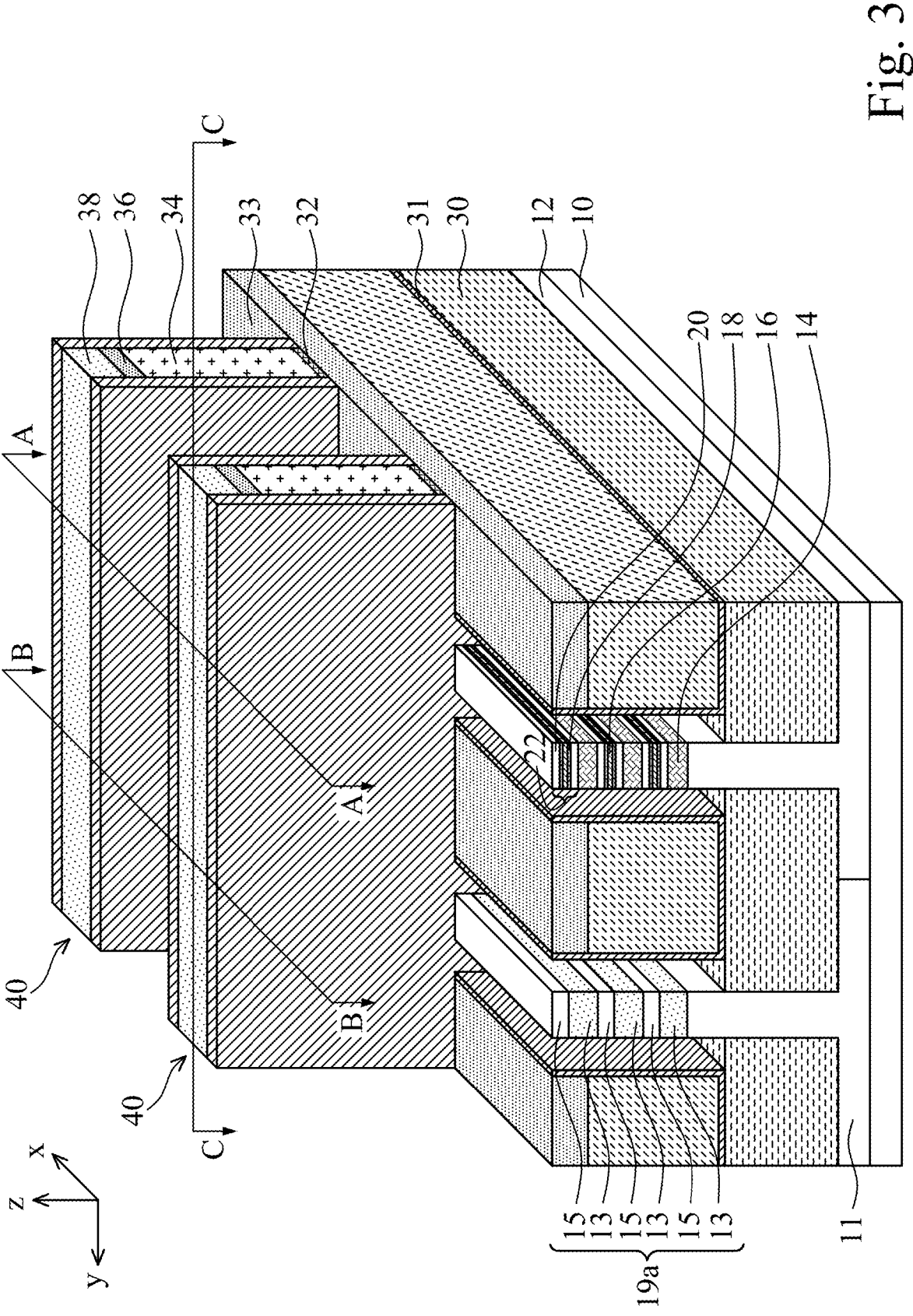

In operation 210, sacrificial gate structures 40 are formed over the fin structures 28, 29, as shown in FIG. 34. After formation of the hybrid fins 27, the isolation layer 30 recessed etched to expose the film stacks in the fin structures 28, 29. A sacrificial gate dielectric layer 32 may be formed conformally over the fin structures 28, 29, the hybrid fins 27, and the isolation layer 30. A sacrificial gate electrode layer 34 may be blanket deposited on the over the sacrificial gate dielectric layer 32. Subsequently, a pad layer 36 and a mask layer 38 are formed over the sacrificial gate electrode layer 34. Next, a patterning operation is performed on the mask layer 38, the pad layer 36, the sacrificial gate electrode layer 34 and the sacrificial gate dielectric layer 32 to form the sacrificial gate structure 40.

In operation 212, sidewall spacers 42 are formed on sidewalls of each sacrificial gate structure 40, as shown in FIG. 34. After the sacrificial gate structure 40 is formed, the sidewall spacers 42 are formed by a blanket deposition of an insulating material followed by anisotropic etch to remove insulating material from horizontal surfaces.

Lines A-A, B-B, and C-C in FIG. 34 indicate cut lines of various views in FIGS. 35A-C to FIGS. 43A-B described below. Particularly, FIGS. 35A-43A are schematic cross-sectional views along line A-A in FIG. 34, FIGS. 35B-34B are schematic cross-sectional views along line B-B in FIG. 34, and FIGS. 35C-34C are schematic cross-sectional views along line C-C in FIG. 34.

Figures 35A, 35B:
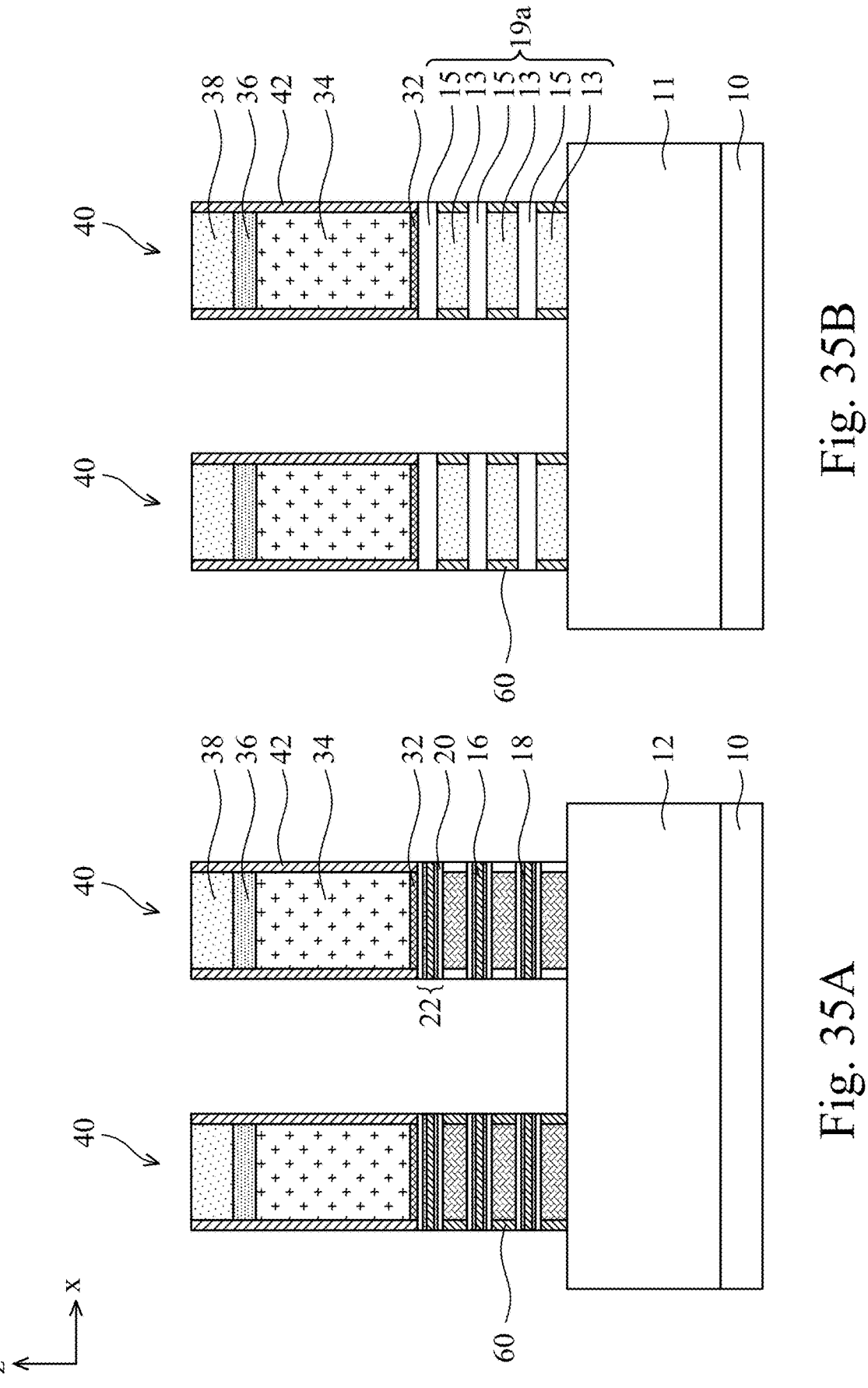
Figure 35C:
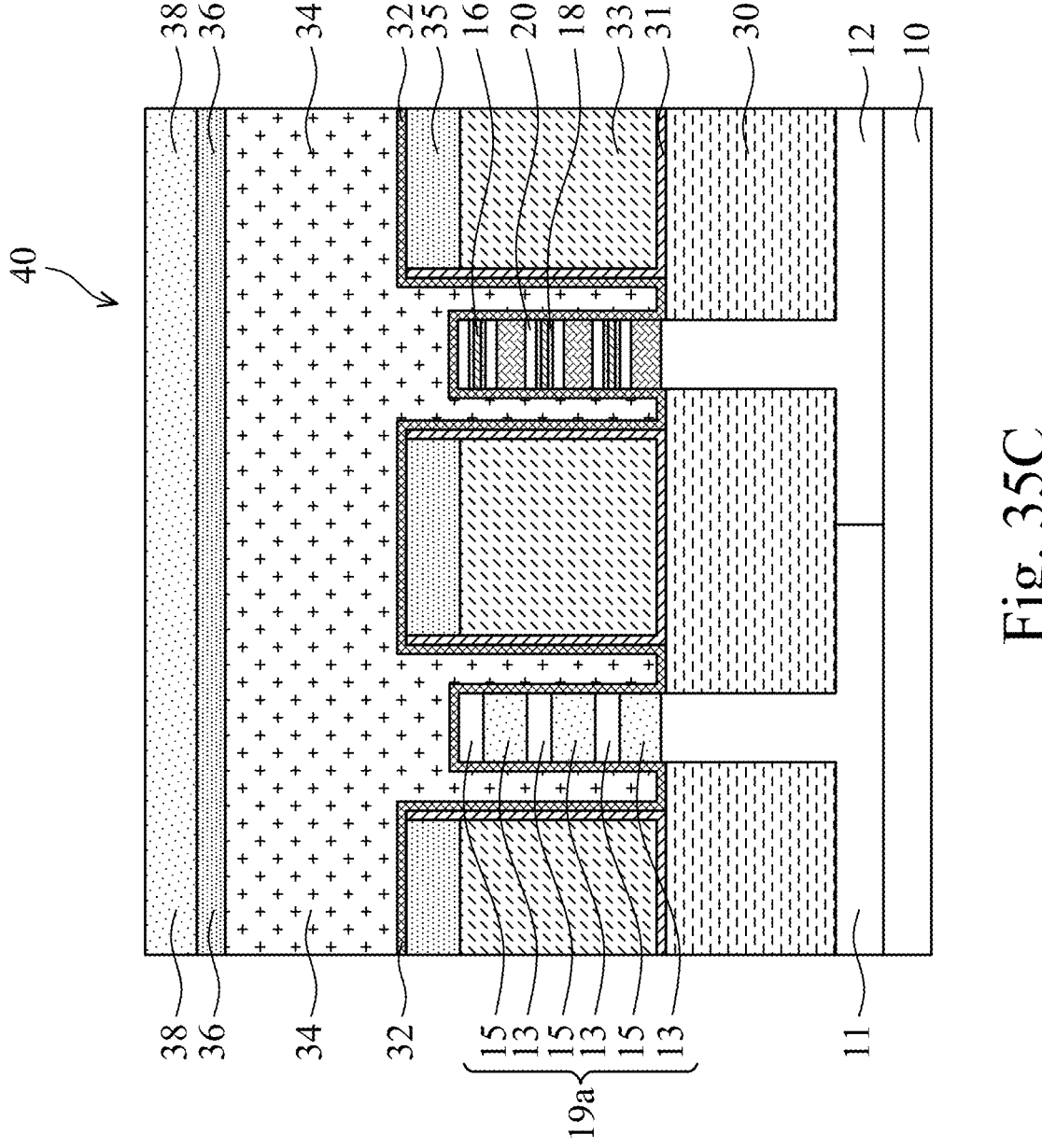

In operation 214, the fin structures 28, 29 are recess etched to remove portions on both sides of the sacrificial gate structure 40, as shown in FIG. 35A-35C. In some embodiments, the fin structures 28, 29 may recessed using separate etching process. In other embodiments, the fin structures 28, 29 are recessed in the same etching process.

In operation 216, inner spacers 60 are formed, as shown in FIGS. 35A-35B. The inner spacers 60 may be formed by first selectively etching the sacrificial channel layers 14 and the first semiconductor layers 13 to form spacer cavities between the channel stacks 22 and between the second semiconductor layers 15 respectively. The sacrificial channel layers 14 and the first semiconductor layers 13 may be etched together or by separate etching processes. An insulating layer is then conformally deposited, then etched back to leave the insulating layer in the spacer cavities as the inner spacers 60.

Figures 36A, 36B:
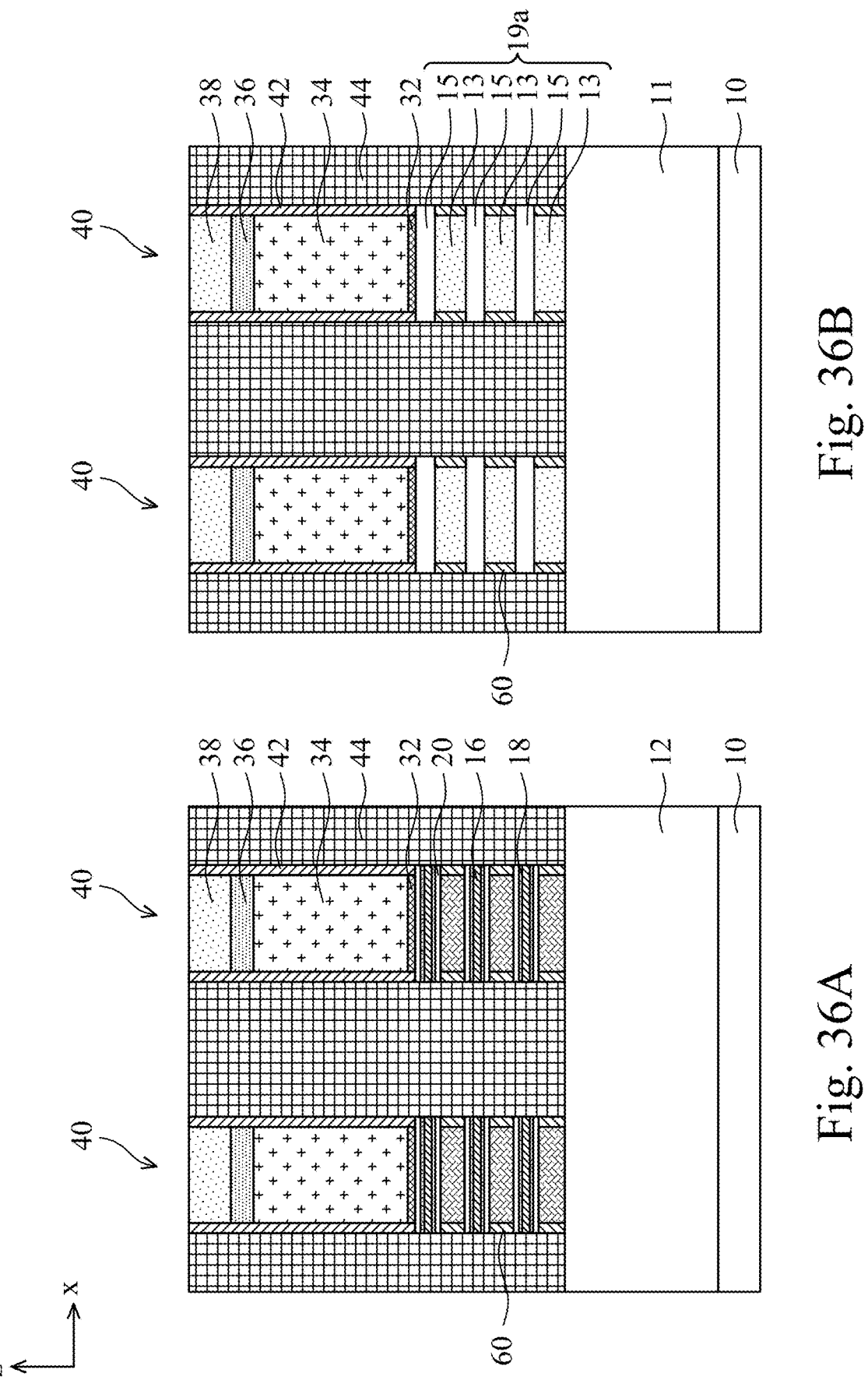
Figure 36C:
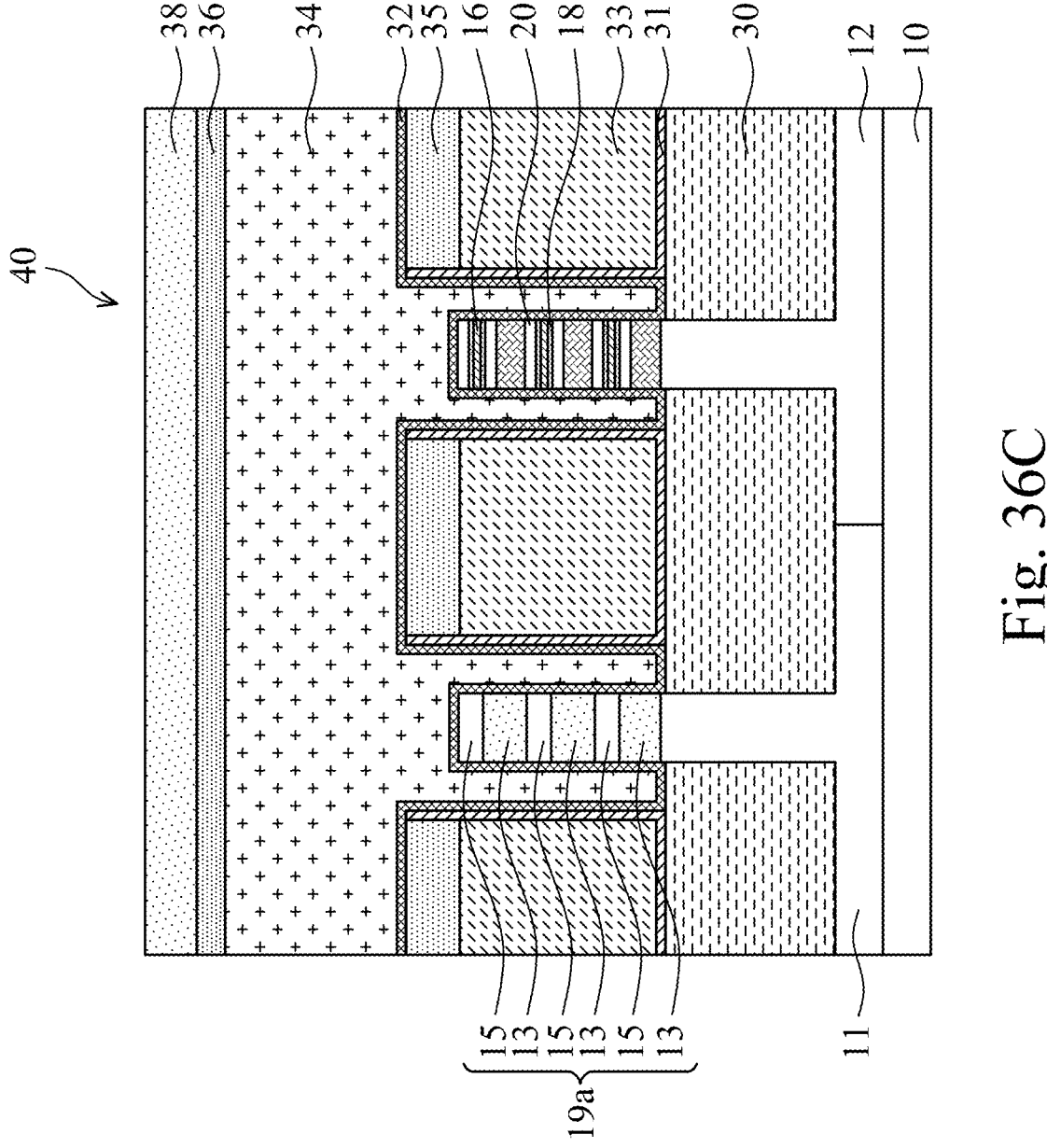

In operation 218, sacrificial source/drain features 44 are formed on both sides of the sacrificial gate structures 40, as shown in FIGS. 36A-36B. The sacrificial source/drain features 44 functions to anchor the channel region of the fin structures 28, 29 during subsequent gate process.

Figures 37A, 37B:
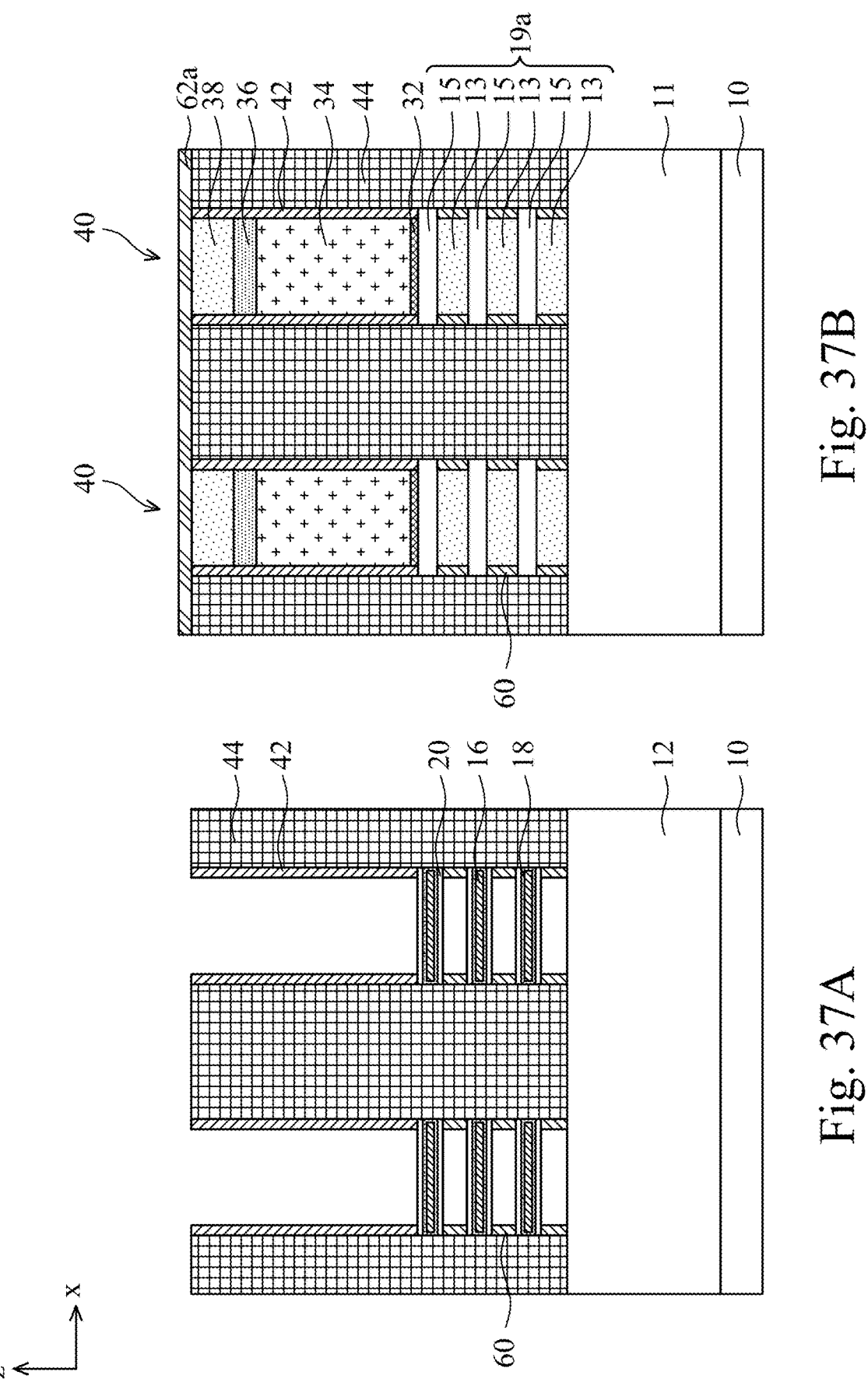

In operation 220, the sacrificial gate electrode layer 34 and sacrificial gate dielectric layer 32 are removed to expose the fin structure 28, as shown FIG. 37A. In some embodiments, a mask 62a may be formed and patterned to cover the n-type device areas, as shown in FIGS. 37B-37C. The sacrificial gate electrode layer 34 can be removed using plasma dry etching and/or wet etching. After removal of the sacrificial gate electrode layer 34, the sacrificial gate dielectric layer 32 is exposed. An etch process may be performed to selectively remove the sacrificial gate dielectric layer 32 exposing the high-k dielectric layer 20, the interfacial layer 18, the two-dimensional (2D) material layer 16, and the sacrificial channel layer 14.

In operation 222, the sacrificial channel layers 14 are removed to expose the channel stacks 22 and form nanosheet channels for the p-type device, as shown FIG. 37A. A suitable etching method may be used to selectively etch the sacrificial channel layers 14 while the high-k dielectric layer 20, the interfacial layer 18, the two-dimensional (2D) material layer 16 in the channel stacks 22 are substantially intact. The sacrificial channel layers 14 can be selectively etched using a suitable wet etchant or a dry etching process.

Figures 38A, 38B:
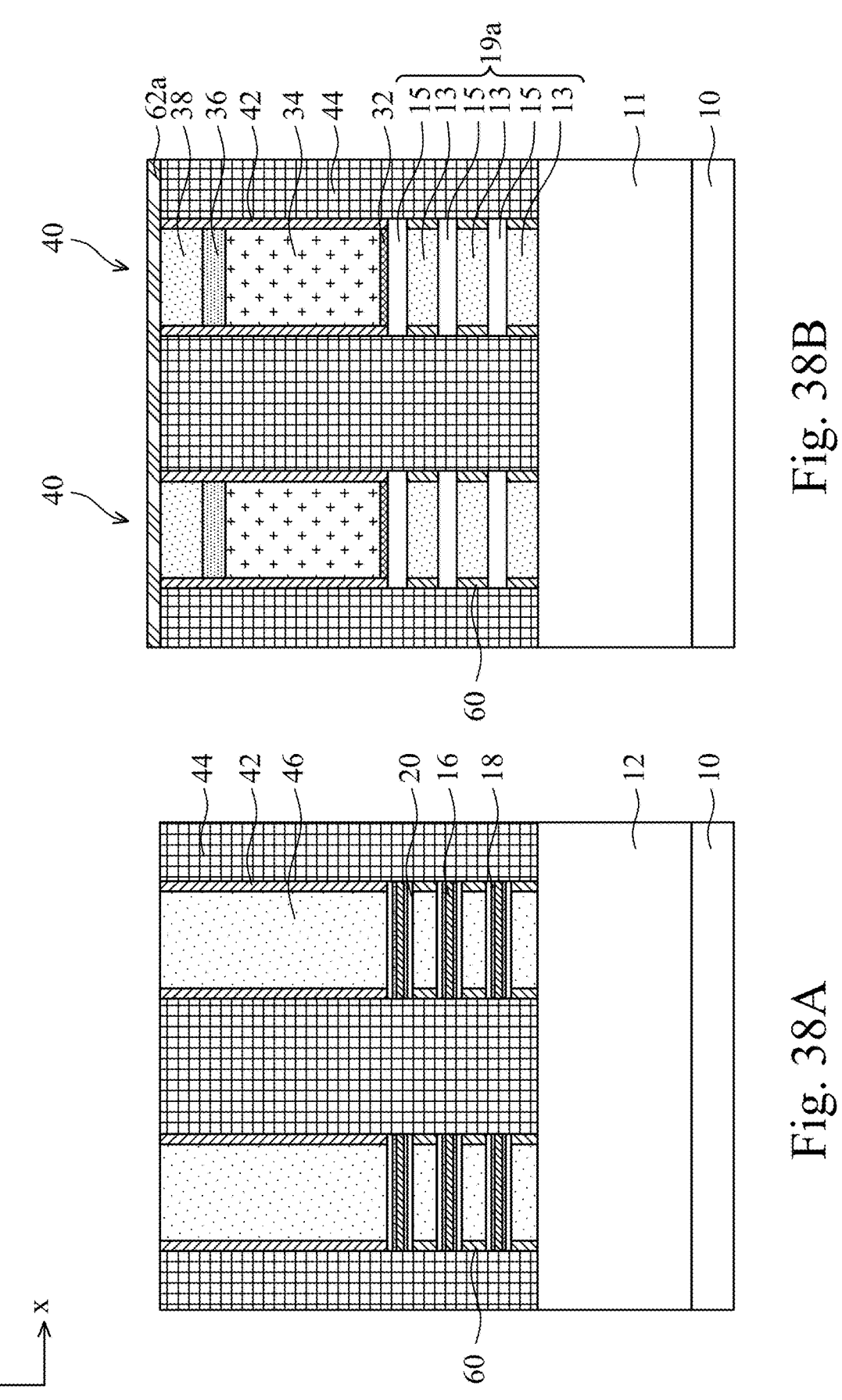
Figure 38C:
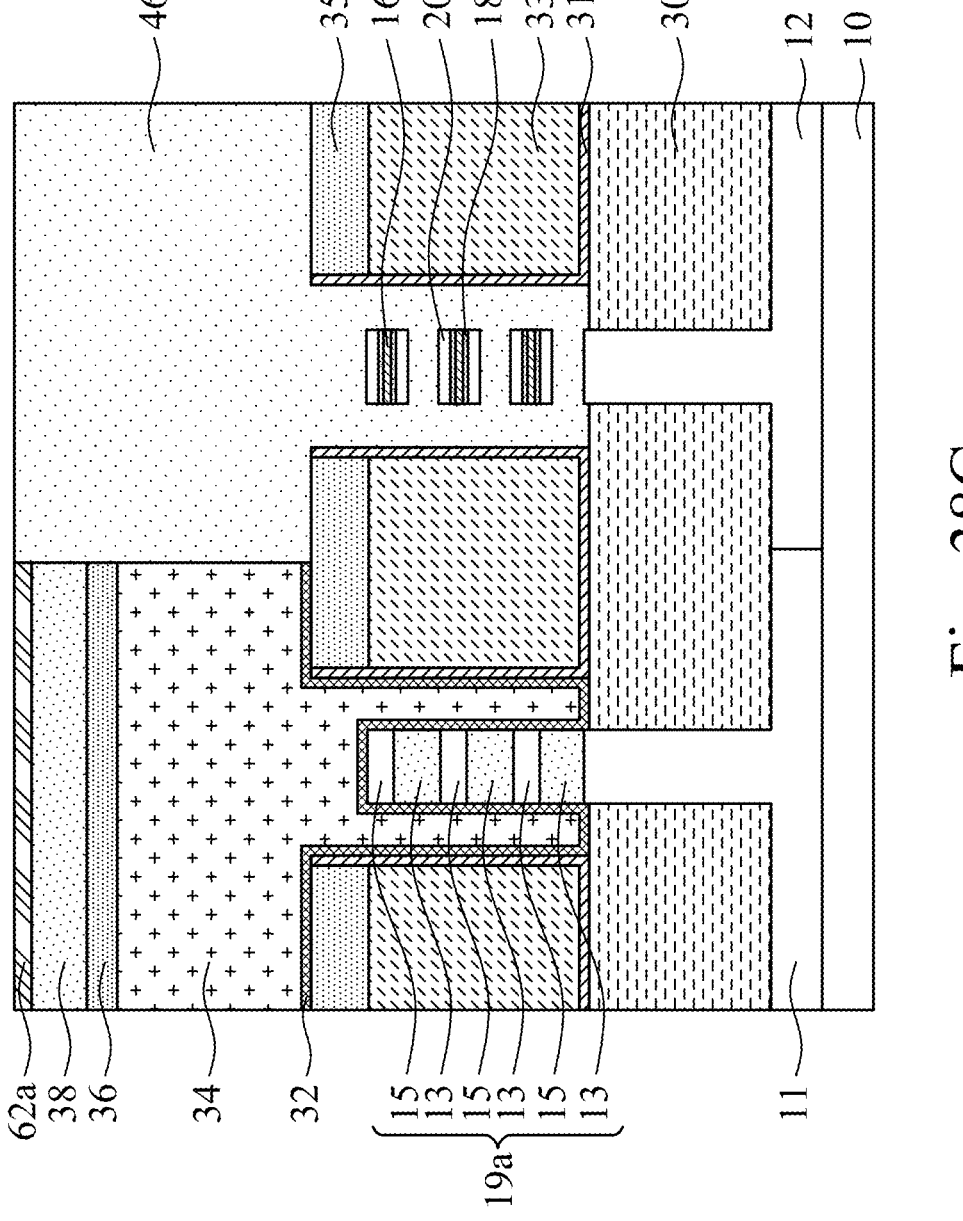

In operation 224, a gate electrode layer 46 is formed around the exposed channel stacks 22, as shown in FIG. 38A. The gate electrode layer 46 is formed around the channel stacks 22.

Figures 39A, 39B:
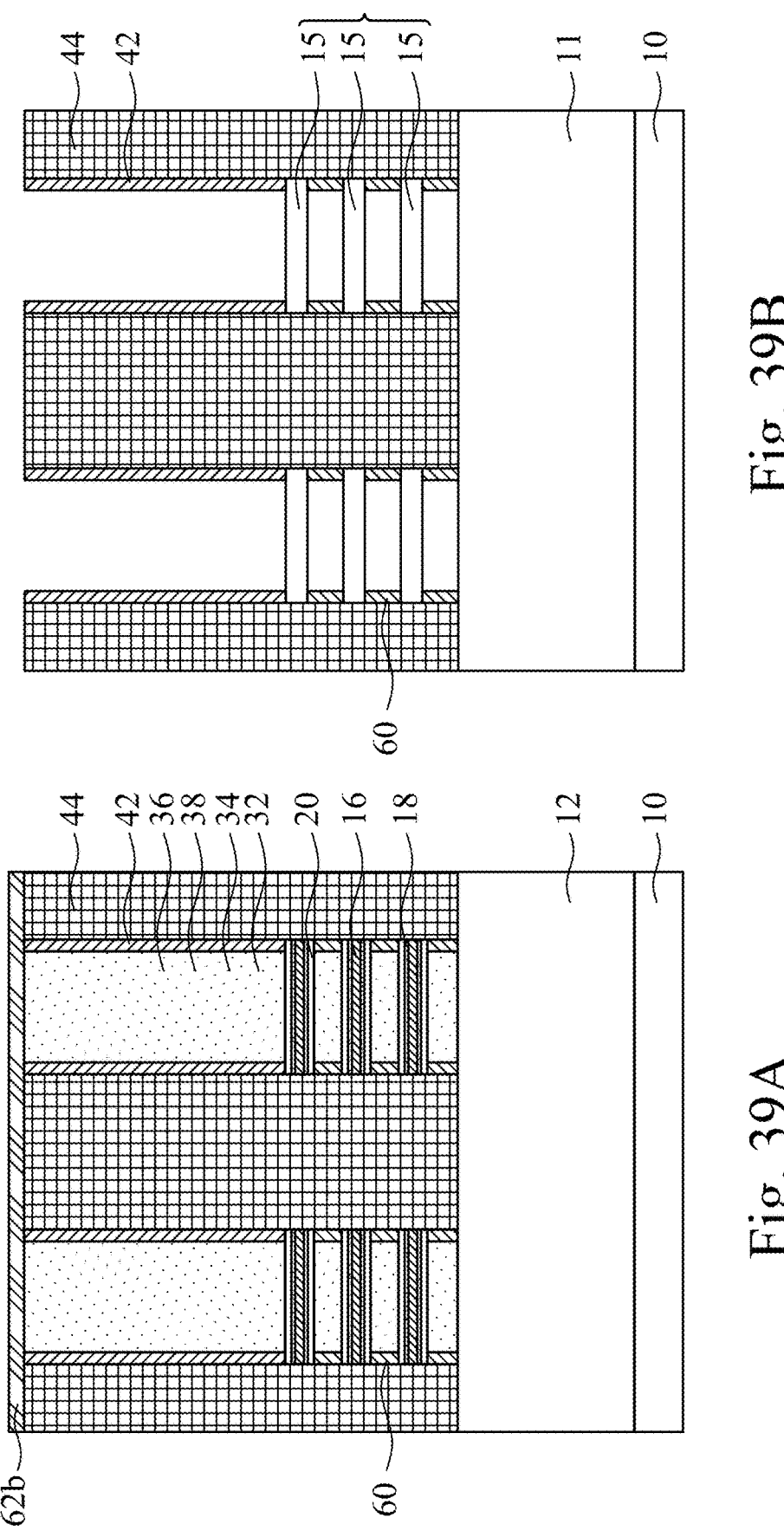
Figure 39C:
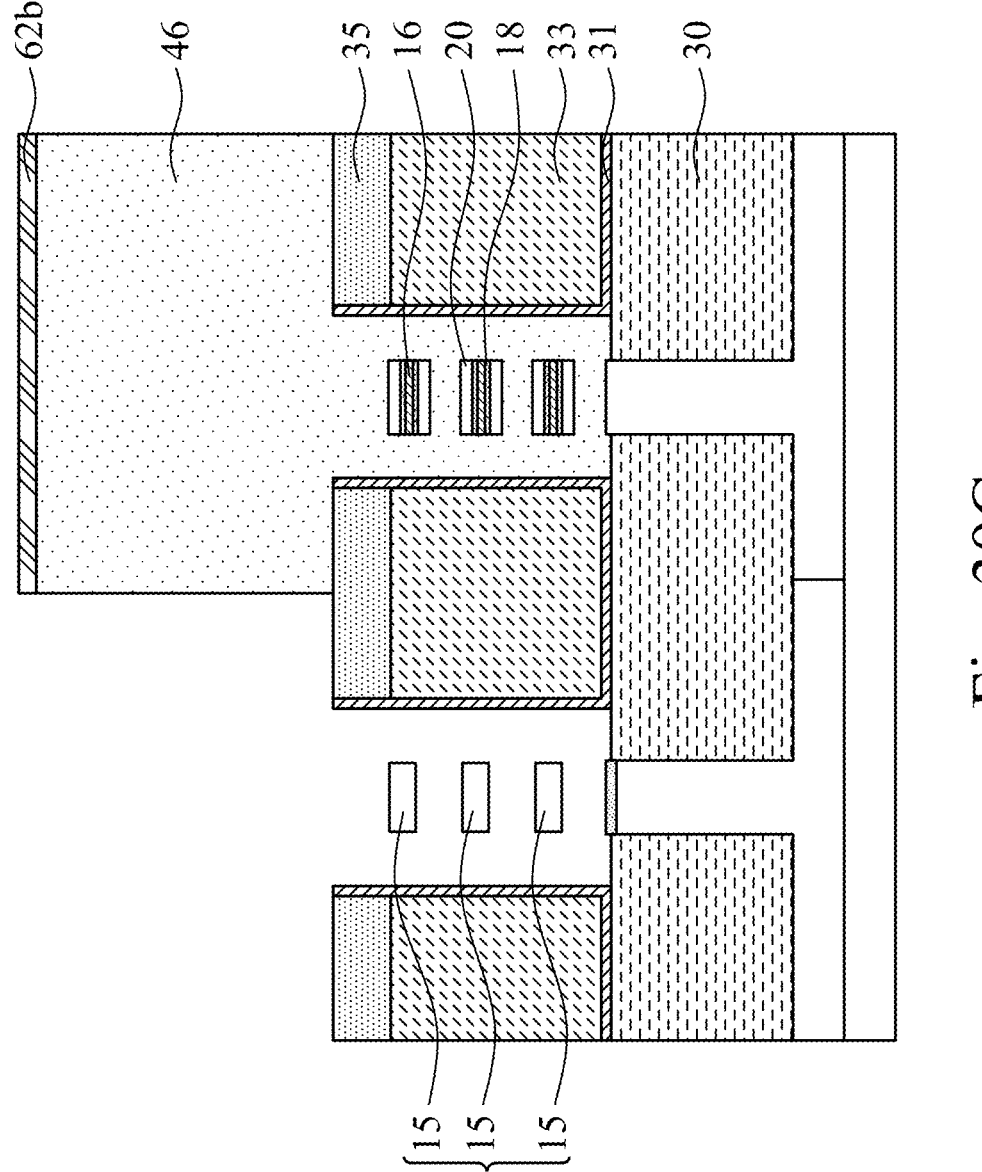
Figures 40A, 40B:
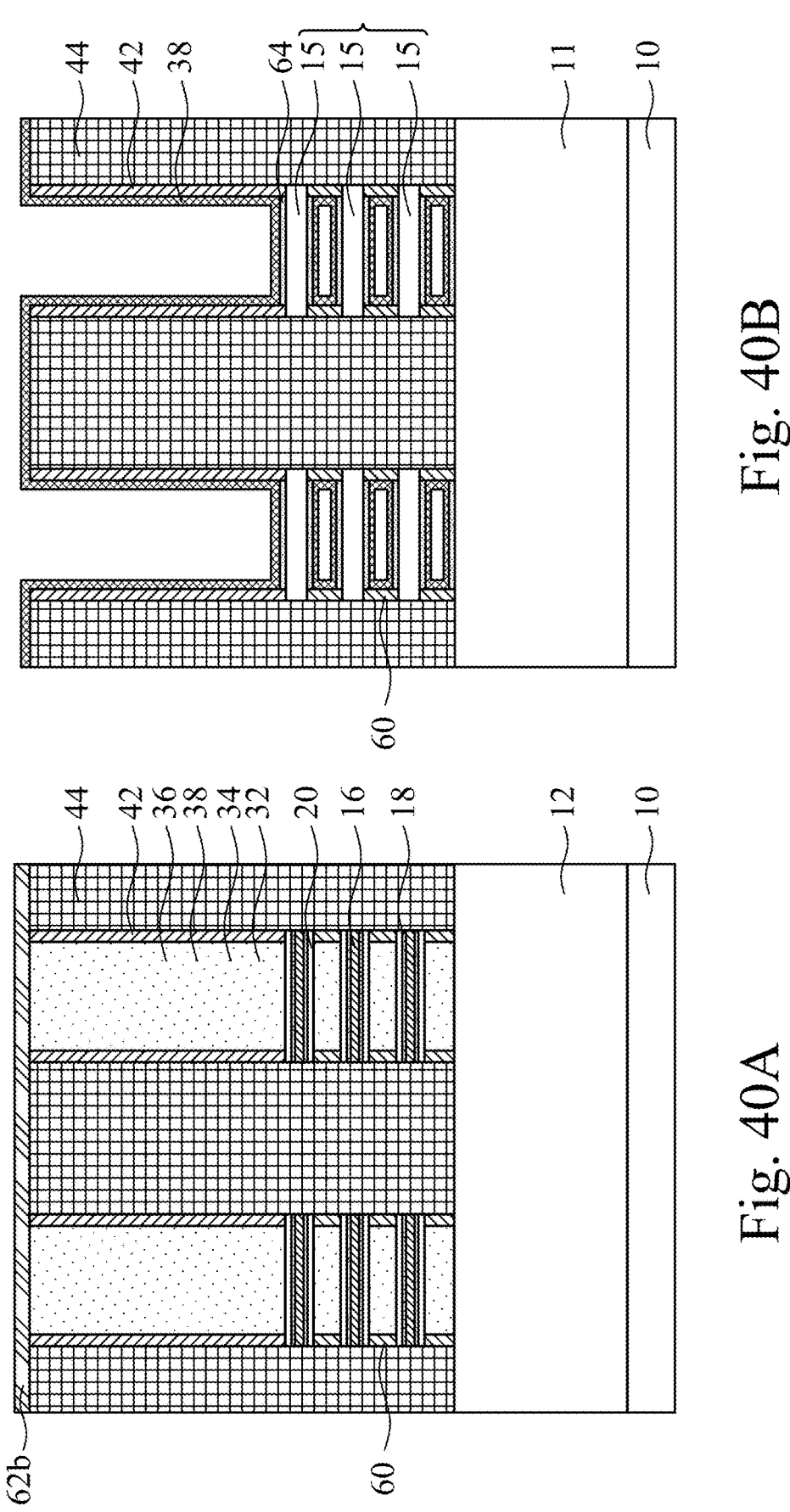
Figures 41A, 41B:
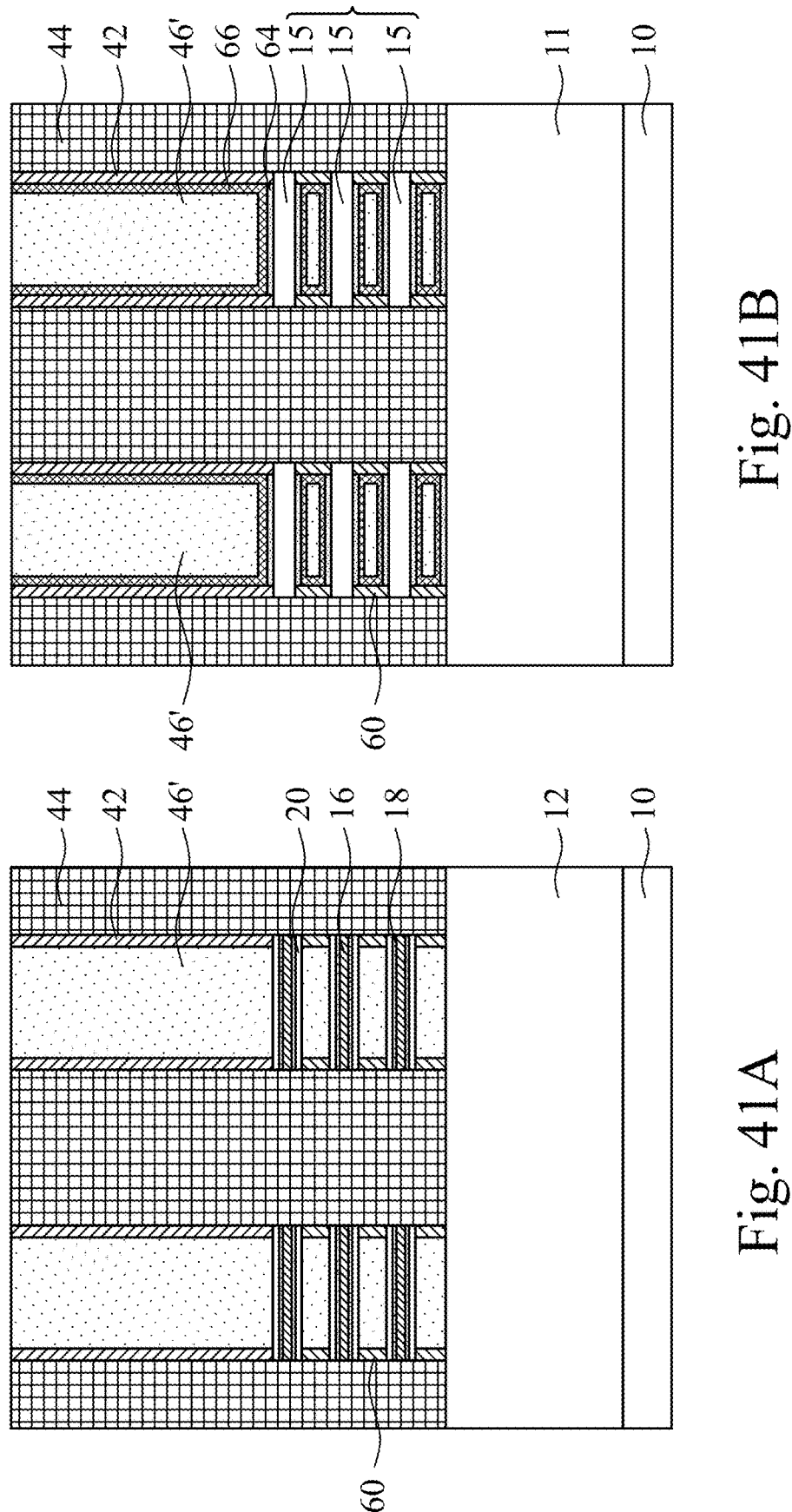
Figure 41C:
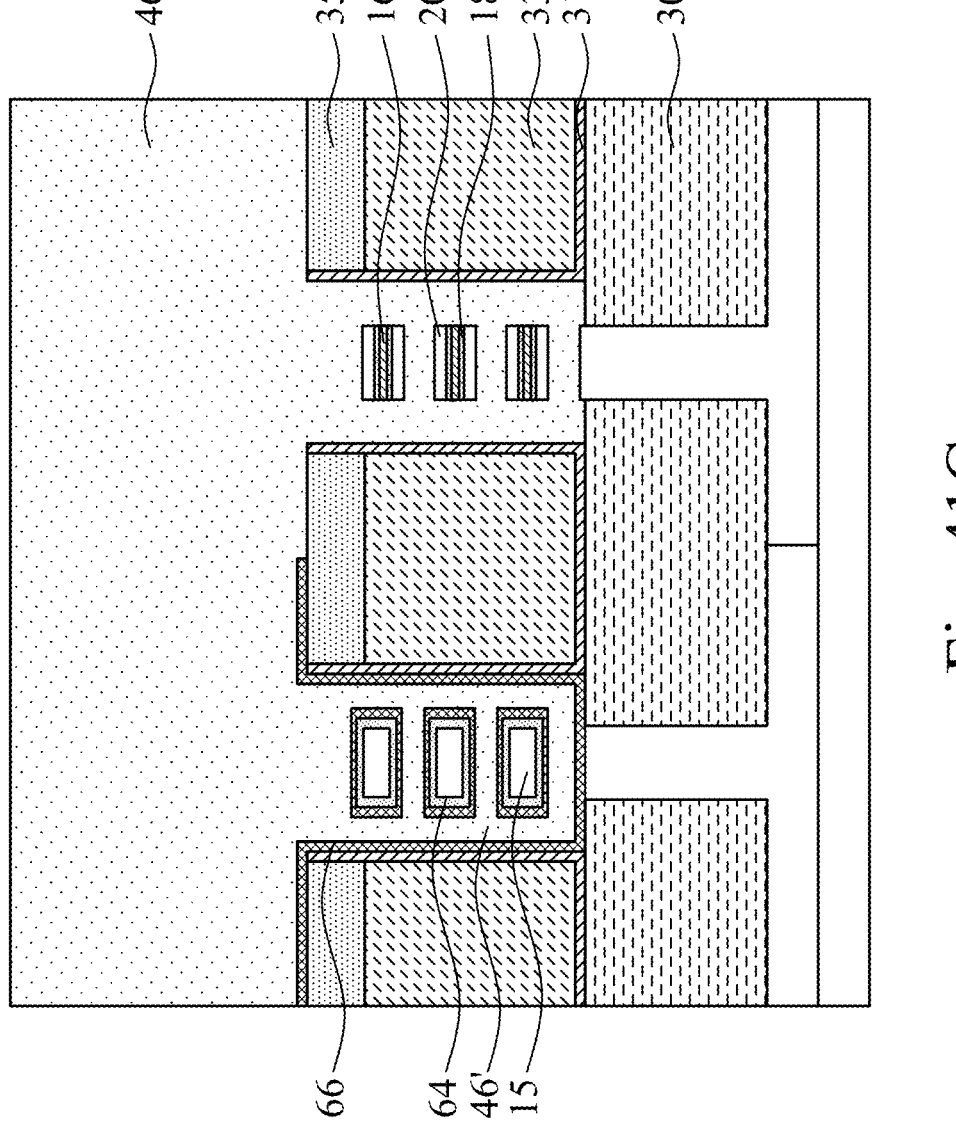

In operation 226, the sacrificial gate electrode layer 34 and sacrificial gate dielectric layer 32 are removed to expose the fin structure 29, as shown FIG. 39B. In some embodiments, a mask 62b may be formed and patterned to cover the p-type device areas, as shown in FIGS. 39A and 39C. The sacrificial gate electrode layer 34 can be removed using plasma dry etching and/or wet etching. After removal of the sacrificial gate electrode layer 34, the sacrificial gate dielectric layer 32 is exposed. An etch process may be performed to selectively remove the sacrificial gate dielectric layer 32 exposing the first semiconductor layers 13 and the second semiconductor layers 15.

In operation 228, the first semiconductor layers 13 are selectively removed exposing the second semiconductor layers 15 as nanosheet channels for the n-type devices, as shown in FIG. 39B.

In operation 230, replacement gate structures are formed over the second semiconductor layers 15 as shown in FIGS. 40B-C and 41B-C. An interfacial layer 64 may be first formed over the exposed semiconductor surfaces, including the exposed surfaces of the second semiconductor layers 15. A gate dielectric layer 66 for the n-type device is then formed. The gate dielectric layer 66 may include one or more layers of a dielectric material, such as silicon oxide, silicon nitride, or high-k dielectric material, other suitable dielectric material, and/or combinations thereof. Examples of high-k dielectric material include $HfO_2$, HfSiO, HfSiON, HfTaO, HfTiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. A gate electrode layer 46' is then formed over the gate dielectric layer 66.

After the formation of the gate electrode layers 46 and 46', a planarization process, such as a CMP process, is performed to remove excess deposition of the gate electrode material and expose the top surface of the sacrificial source/drain features 44.

In operation 232, the sacrificial source/drain features 44 are removed so that replacement source/drain features 48 and 48' can be formed. The sacrificial source/drain features 44 can be removed using a suitable etching method. After removal of the sacrificial source/drain features 44, sides of the channel stacks 22, sides of the second semiconductor layers 15 and the inner spacers 60 are exposed.

Figures 42A, 42B:
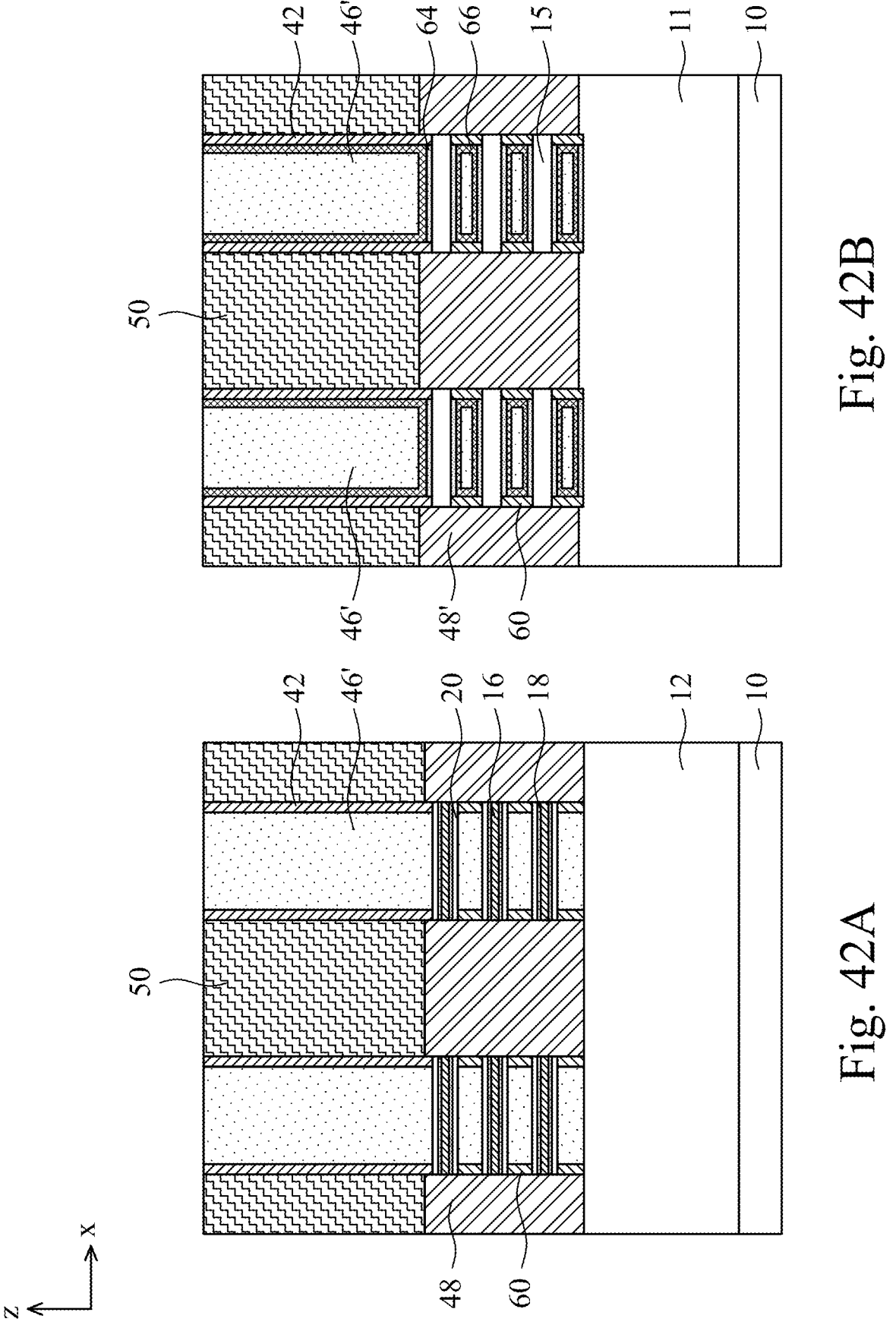

In operation 234, a metallic material may be deposited in cavities of the sacrificial source/drain features 44 to form the replacement source/drain features 48, 48', as shown in FIGS. 42A-42C. For p-type device, the replacement source/drain features 48 may be formed on the substrate 10 to be in contact with the sides of the channel stacks 22 and the inner spacers 60. For n-type device, the replacement source/drain features 48' may be formed on the substrate 10 to be in contact with the sides of the second semiconductor layers 15 and the inner spacers 60.

In some embodiments, the replacement source/drain features 48 and 48' may include a metal, such as Ti, Co, Ni, W, Pt, Ta, Pd, Mo, Al, and other suitable metal. In some embodiments, the replacement source/drain features 48 may be bi-metal materials, for example may be stacks of Ti/W, Ti/Co, Ti/Mo, or the like.

The replacement source/drain features 48 and 48' may be formed in any suitable methods, such as PVD, CVD, ALD, or other methods. The replacement source/drain features 48 and 48' are formed by a temperature lower than about 600° C. to prevent the gate electrode layer 46 from diffusing into the adjacent layers.

In some embodiments, the replacement source/drain features 48 for p-type devices and the replacement source/drain features 48' for n-type devices may be formed from different materials using separate processes. In other embodiments, the replacement source/drain features 48 for p-type devices and the replacement source/drain features 48' for n-type devices may be formed from same materials using the same deposition process followed by different doping processes.

In some embodiments, an interlayer dielectric (ILD) layer 50 is formed over the replacement source/drain features 48, 48'. A CMP process may be performed to remove excessive ILD layer 50 and expose the gate electrode layers 46, 46', as shown in FIGS. 42A-42C.

Figures 43A, 43B:
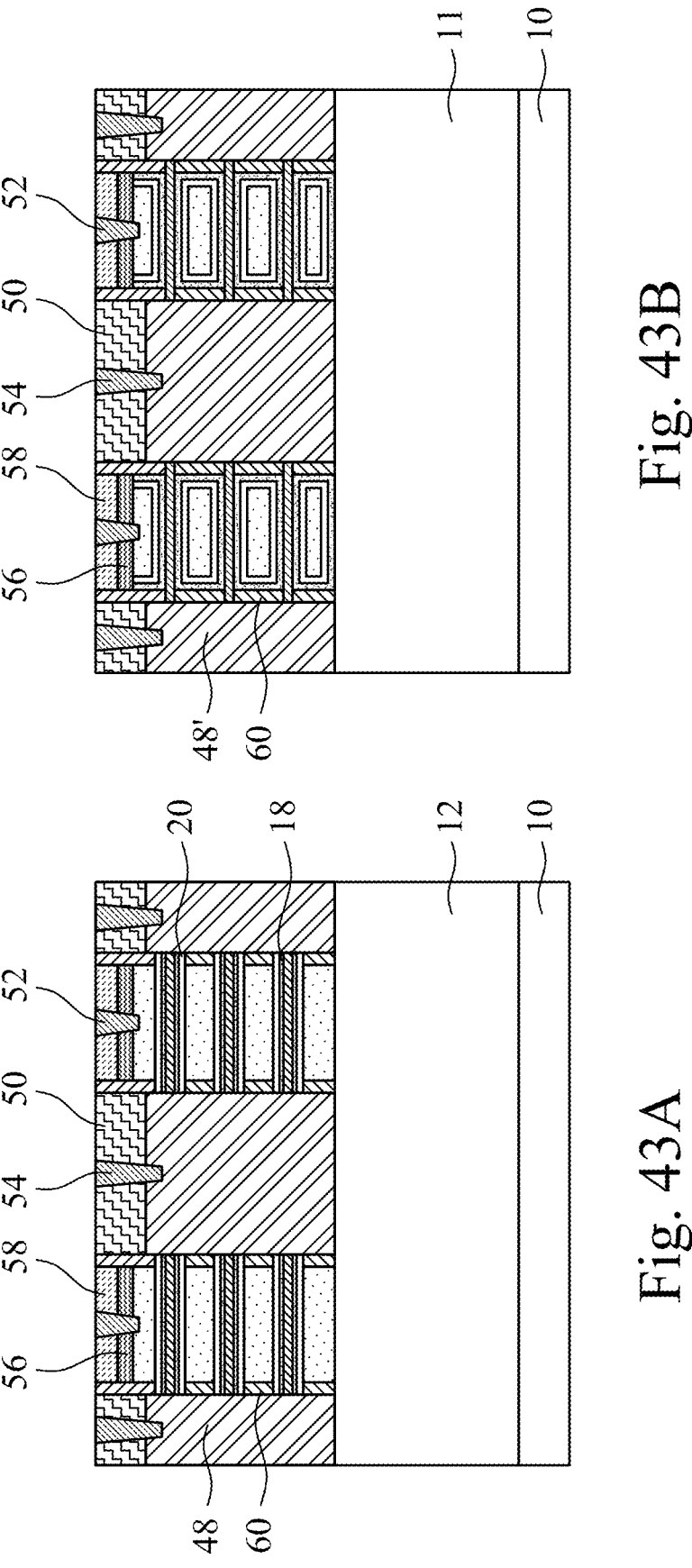

In operation 236, gate contacts 52 and source/drain contacts 54 are formed as shown in FIGS. 43A-43C. In some embodiments, the gate electrode layers 46, 46' are recessed using any suitable process, such as a dry etch, a wet etch, or a combination thereof. A self-aligned contact layer 56 is formed over the gate electrode layers 46, 46' between the sidewall spacers 42. The self-aligned contact layer 56 may be formed by a blanket deposition process, followed by a CMP process to the level of the sidewall spacers 42 to remove excessive materials over the sidewall spacers 42, then selectively recessed to form trenches between the sidewall spacers 42 and above the self-aligned contact layer 56. A hard mask layer 58 is then formed over the self-aligned contact layer 56. Contact holes may be formed by any suitable process in the hard mask layer 58 and the self-aligned contact layer 56. Subsequently, a conductive material layer fills in the contact holes to form the gate contacts 52. Similarly, contact holes may be formed through the ILD layer 50 and subsequently filled with a conductive material to form the source/drain contacts 54. Suitable photolithographic and etching techniques are used to form the contact holes through various layers. After formation of the gate contacts 52 and source/drain contacts 54, interconnect structure may be formed to further connect the replacement source/drain features 48, 48' and the gate electrode layers 46, 46' to a power rail or signal lines.

Various embodiments or examples described herein offer multiple advantages over the state-of-art technology. According to embodiments of the present disclosure, two-dimensional (2D) materials may be used as nanosheet channels for multi-channel transistors. Nanosheet channels made two-dimensional (2D) materials can achieve the same drive current at smaller dimensions and/or fewer number of channels, therefore enable scaling down and/or boost derive current. Embodiments of the present disclosure also provide a solution of P-type and N-type balancing in a device without increasing footprint of the device.

It will be understood that not all advantages have been necessarily discussed herein, no particular advantage is required for all embodiments or examples, and other embodiments or examples may offer different advantages.

Some embodiments of the present provide a semiconductor device. The semiconductor device includes a first two-dimensional (2D) material layer having a first end and a second end, a first source/drain feature in contact with the first end of the first two-dimensional (2D) material layer, a second source/drain feature in contact with the second end of the first two-dimensional (2D) material layer, and a gate electrode layer surrounding the first two-dimensional (2D) material layer.

Some embodiments of the present disclosure provide a semiconductor device. The semiconductor device includes a first transistor comprising a first source, a first drain, and a first multi-channel connecting the first source and first drain, wherein the first multi-channel comprises two or more two-dimensional (2D) material layers, and a second transistor comprising, a second source, a second drain, and a second multi-channel connecting the second source and second drain, wherein the second channel comprises two or more semiconductor layers.

Some embodiments of the present disclosure provide a method for forming a semiconductor device. The method includes alternately depositing two or more channel stacks and two or more sacrificial channel layers, wherein each of the two or more sacrificial channel layers is deposited between the channel stacks, and depositing each of the two or more channel stacks comprises depositing a two-dimensional (2D) material layer, etching through the two or more channel stacks and the two or more sacrificial channel layers to form a fin structure, removing the two or more sacrificial channel layers to form two or more channels from the two or more channel stacks, and depositing a gate electrode layer around the two or more channels.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device, comprising:
a first channel stack comprising:
   a first two-dimensional (2D) material layer having a first end and a second end; and
   two interfacial layers, wherein the first two-dimensional (2D) material layer is sandwiched between the two interfacial layers;
a first source/drain feature in contact with the first end of the first two-dimensional (2D) material layer;
a second source/drain feature in contact with the second end of the first two-dimensional (2D) material layer;
a gate dielectric layer surrounding the first channel stack, and
a sidewall spacer disposed between the first source/drain feature and the gate dielectric layer, wherein one of the two interfacial layers is disposed between the first two-dimensional (2D) material layer and the sidewall spacer.

2. The semiconductor device of claim 1, further comprising a second channel stack, wherein the second channel stack comprises a second two-dimensional (2D) material layer in contact with the first and second source/drain features, and the gate dielectric layer surrounds the second two-dimensional (2D) material layer.

3. The semiconductor device of claim 2, further comprising spacers disposed between the gate dielectric layer and the first and second source/drain features.

4. The semiconductor device of claim 3, wherein the spacers comprise inner spacers disposed between the first channel stack and the second channel stack.

5. The semiconductor device of claim 4, wherein the inner spacers are in contact with at least one of the two interfacial layers, and the sidewall spacer faces one of the two interfacial layers.

6. The semiconductor device of claim 1, wherein the two interfacial layers are connected and surround the two-dimensional (2D) material layer.

7. The semiconductor device of claim 1, wherein each of the first and second source/drain features comprises a metal, a bi-metal, a metal oxide, or a combination thereof.

8. A semiconductor device, comprising:
a first transistor comprising:
a first source;
a first drain; and
a first multi-channel connecting the first source and first drain, wherein the first multi-channel comprises two or more channel stacks comprising a two-dimensional (2D) material layer and two interfacial layers; and
a second transistor comprising:
a second source;
a second drain; and
a second multi-channel connecting the second source and second drain, wherein the second multi-channel comprises two or more silicon layers.

9. The semiconductor device of claim 8, wherein the first transistor is a p-type device and the second transistor is an n-type device.

10. The semiconductor device of claim 9, wherein the first source and the first drain including a metal, a bi-metal, a metal oxide, or a combination thereof.

11. The semiconductor device of claim 9, wherein the two interfacial layers are connected and surround the two-dimensional (2D) material layer.

12. The semiconductor device of claim 8, wherein the first transistor further comprises an inner spacer deposed between the two or more channel stacks and in contact with one of the interfacial layers in the two or more channel stacks.

22

13. A method for forming a semiconductor device, comprising:
alternately depositing two or more channel stacks and two or more sacrificial channel layers, wherein each of the two or more sacrificial channel layers is deposited between the sacrificial channel stacks, and each of the two or more channel stacks comprises:
a two-dimensional (2D) material layer; and
two interfacial layers, wherein the two-dimensional (2D) material layer is sandwiched between the two interfacial layers;
etching through the two or more channel stacks and the two or more sacrificial channel layers to form a fin structure;
at least partially removing the two or more sacrificial channel layers to form two or more channels from the two or more channel stacks; and
depositing a gate dielectric layer around the two or more channels.

14. The method of claim 13, wherein depositing the two or more sacrificial channel layers comprising depositing two or more dielectric layers.

15. The method of claim 14, further comprising forming a sacrificial gate structure over the fin structure;
forming sidewall spacers on sidewalls of the sacrificial gate structure;
recess etching the fin structure outside the sidewall spacers and the sacrificial gate structures; and
forming sacrificial source/drain structures.

16. The method of claim 15, wherein at least partially removing the two or more sacrificial channel layers comprises keeping end portions of the sacrificial channel layers between the two or more channel stacks, the end portions of the sacrificial channel layers function as inner spacers.

17. The method of claim 16, wherein depositing the gate dielectric layer comprises depositing the gate dielectric layer on the two interfacial layers and end portions of the sacrificial channel layers.

18. The method of claim 15, further comprising, prior to forming sacrificial source/drain structures,
recess etching the sacrificial channel layer; and
forming inner spacers between the two or more channel stacks.

19. The method of claim 18, wherein depositing the gate dielectric layer comprises depositing the gate dielectric layer on the two interfacial layers and the inner spacers.

20. The method of claim 15, further comprising:
depositing a gate electrode layer over the gate dielectric layer;
removing the sacrificial source/drain features; and
forming replacement source/drain features.

* * * * *